(12) United States Patent
Tanaka et al.

(10) Patent No.: US 7,700,462 B2
(45) Date of Patent: Apr. 20, 2010

(54) LASER IRRADIATION METHOD, LASER IRRADIATION APPARATUS, AND METHOD FOR MANUFACTURING SEMICONDUCTOR DEVICE

(75) Inventors: Koichiro Tanaka, Atsugi (JP); Shunpei Yamazaki, Setagaya (JP)

(73) Assignee: Semiconductor Energy Laboratory Co., Ltd, Atsugi-shi, Kanagawa-ken ( * ) Notice: Subject to any disclaimer, the term of this patent is extended or adjusted under 35 U.S.C. 154(b) by 0 days.

(21) Appl. No.: 10/787,120

(22) Filed: Feb. 27, 2004

(65) Prior Publication Data

US 2004/0171237 A1 Sep. 2, 2004

Related U.S. Application Data

(63) Continuation-in-part of application No. 10/678,083, filed on Oct. 6, 2003, now abandoned.

(30) Foreign Application Priority Data

Feb. 28, 2003 (JP) ............................. 2003-054695

(51) Int. Cl.
*H01L 21/00* (2006.01)
*H01L 21/84* (2006.01)
*H01L 21/20* (2006.01)
*H01L 21/36* (2006.01)
*H01L 21/26* (2006.01)

(52) U.S. Cl. ...................... 438/487; 438/53; 438/795; 438/166

(58) Field of Classification Search ................. 438/487, 438/166, 786, 795, 7, 378
See application file for complete search history.

(56) References Cited

U.S. PATENT DOCUMENTS 5,304,357 A * 4/1994 Sato et al. ................. 118/50.1

(Continued)

FOREIGN PATENT DOCUMENTS

EP 0 886 319 12/1998

(Continued)

OTHER PUBLICATIONS

Office Action dated Sep. 28, 2006 for U.S. Appl. No. 10/678,083.

(Continued)

*Primary Examiner*—Chuong Anh Luu
(74) *Attorney, Agent, or Firm*—Eric J. Robinson; Robinson Intellectual Property Law Office, P.C.

(57) ABSTRACT

When the CW laser oscillator is employed in the manufacturing process of the semiconductor device, it is expected to obtain the device of high performance. However, the CW oscillator provides only a small beam spot and forms an inferior crystalline region when it is scanned on the semiconductor film. It is necessary to minimize such an inferior crystalline region because it gives a problem in terms of high integration of the semiconductor element. In view of the problem, the present invention is to form a long crystalline region as suppressing the formation of the inferior crystalline region by irradiating the fundamental wave with the harmonic supplementarily (refer to FIG. 1). The present invention also includes a constitution in which a part having high energy density in the fundamental wave is irradiated to a part having low energy density in the harmonic.

16 Claims, 19 Drawing Sheets

U.S. PATENT DOCUMENTS

| | | | |
|---|---|---|---|
| 5,612,251 A | 3/1997 | Lee | |
| 5,643,801 A | 7/1997 | Ishihara et al. | |
| 5,811,751 A | 9/1998 | Leong et al. | |
| 5,891,764 A * | 4/1999 | Ishihara et al. | 438/151 |
| 5,897,799 A | 4/1999 | Yamazaki et al. | |
| 5,900,980 A | 5/1999 | Yamazaki et al. | |
| 5,923,962 A | 7/1999 | Ohtani et al. | |
| 5,953,597 A | 9/1999 | Kusumoto et al. | |
| 5,959,779 A | 9/1999 | Yamazaki et al. | |
| 6,002,523 A | 12/1999 | Tanaka | |
| 6,020,224 A | 2/2000 | Shimogaichi et al. | |
| 6,038,075 A | 3/2000 | Yamazaki et al. | |
| 6,423,585 B1 * | 7/2002 | Yamazaki et al. | 438/166 |
| 6,426,245 B1 | 7/2002 | Kawasaki et al. | |
| 6,451,631 B1 | 9/2002 | Grigoropoulos et al. | |
| 6,528,397 B1 | 3/2003 | Taketomi et al. | |
| 6,537,864 B1 | 3/2003 | Aya et al. | |
| 6,544,825 B1 | 4/2003 | Yamazaki | |
| 6,548,370 B1 | 4/2003 | Kasahara et al. | |
| 6,645,454 B2 | 11/2003 | Voutsas | |
| 6,693,257 B1 | 2/2004 | Tanaka | |
| 6,700,096 B2 | 3/2004 | Yamazaki et al. | |
| 6,803,296 B2 * | 10/2004 | Miyairi | 438/486 |
| 6,806,498 B2 * | 10/2004 | Taketomi et al. | 257/64 |
| 6,861,614 B1 * | 3/2005 | Tanabe et al. | 219/121.66 |
| 6,884,699 B1 * | 4/2005 | Ogawa et al. | 438/166 |
| 6,897,166 B2 | 5/2005 | Sotani et al. | |
| 6,927,109 B1 | 8/2005 | Tanaka et al. | |
| 7,026,227 B2 * | 4/2006 | Tanaka | 438/487 |
| 7,056,810 B2 | 6/2006 | Yamazaki et al. | |
| 7,102,750 B2 * | 9/2006 | Takami | 356/432 |
| 7,125,761 B2 | 10/2006 | Tanaka | |
| 7,160,764 B2 | 1/2007 | Tanaka | |
| 7,498,212 B2 | 3/2009 | Tanaka | |
| 2002/0031876 A1 | 3/2002 | Hara et al. | |
| 2002/0094008 A1 | 7/2002 | Tananka | |
| 2003/0136772 A1 | 7/2003 | Yamazaki et al. | |
| 2003/0148565 A1 | 8/2003 | Yamanaka | |
| 2004/0040938 A1 | 3/2004 | Yamazaki et al. | |
| 2004/0069751 A1 * | 4/2004 | Yamazaki et al. | 219/121.6 |
| 2004/0119955 A1 | 6/2004 | Tanaka | |
| 2004/0169023 A1 | 9/2004 | Tanaka | |
| 2004/0171237 A1 | 9/2004 | Tanaka et al. | |
| 2004/0198028 A1 | 10/2004 | Tanaka et al. | |
| 2004/0253838 A1 | 12/2004 | Yamazaki et al. | |
| 2004/0259387 A1 | 12/2004 | Yamazaki et al. | |
| 2004/0266079 A1 | 12/2004 | Shimomura et al. | |
| 2005/0067384 A1 | 3/2005 | Talwar et al. | |
| 2006/0019474 A1 * | 1/2006 | Inui et al. | 438/487 |
| 2007/0158315 A1 | 7/2007 | Tanaka et al. | |
| 2007/0184590 A1 * | 8/2007 | Tanaka et al. | 438/166 |
| 2009/0072162 A1 | 3/2009 | Tanaka | |

FOREIGN PATENT DOCUMENTS

| | | | |
|---|---|---|---|
| EP | 1 049 144 | | 11/2000 |
| JP | 53-029323 | | 3/1978 |
| JP | 56-029323 | | 3/1981 |
| JP | 57-104217 | | 6/1982 |
| JP | 57-183023 | | 11/1982 |
| JP | 02-153582 | | 6/1990 |
| JP | 04-124813 | | 4/1992 |
| JP | 05-021340 | | 1/1993 |
| JP | 05-226790 | | 9/1993 |
| JP | 07-183540 | | 7/1995 |
| JP | 07-187890 | | 7/1995 |
| JP | 08-083765 | | 3/1996 |
| JP | 08-186268 | | 7/1996 |
| JP | 11-307450 | | 11/1999 |
| JP | 2000-012484 | | 1/2000 |
| JP | 2001-044120 | * | 2/2001 |
| JP | 2001-189458 | | 7/2001 |
| JP | 2002-217125 | | 8/2002 |
| JP | 2002-231628 | | 8/2002 |
| JP | 2002-261015 | | 9/2002 |
| JP | 2002-289524 | | 10/2002 |
| JP | 2003-051446 | | 2/2003 |
| JP | 2003-347237 | | 12/2003 |
| JP | 2004-128421 | | 4/2004 |
| WO | WO 02/061816 | | 8/2002 |
| WO | WO 2004/023537 | | 3/2004 |

OTHER PUBLICATIONS

Office Action (U.S. Appl. No. 10/678,083) dated Apr. 4, 2007.
Office Action (Application No. 200410007632.7 CN7001) dated Apr. 6, 2007.
European Search Report dated Sep. 3, 2004 for EP 04 00 4257.
Official Action dated Mar. 14, 2006 for U.S. Appl. No. 10/678,083.
Official Action dated Oct. 18, 2005 for U.S. Appl. No. 10/678,083 filed Oct. 6, 2003 to Yamazaki.
Office Action (U.S. Appl. No. 10/678,083) Dated Mar. 21, 2008.
Office Action (U.S. Appl. No. 10/678,083) Dated Apr. 29, 2009.
Office Action (U.S. Appl. No. 10/678,083) Dated Oct. 2, 2008.

* cited by examiner

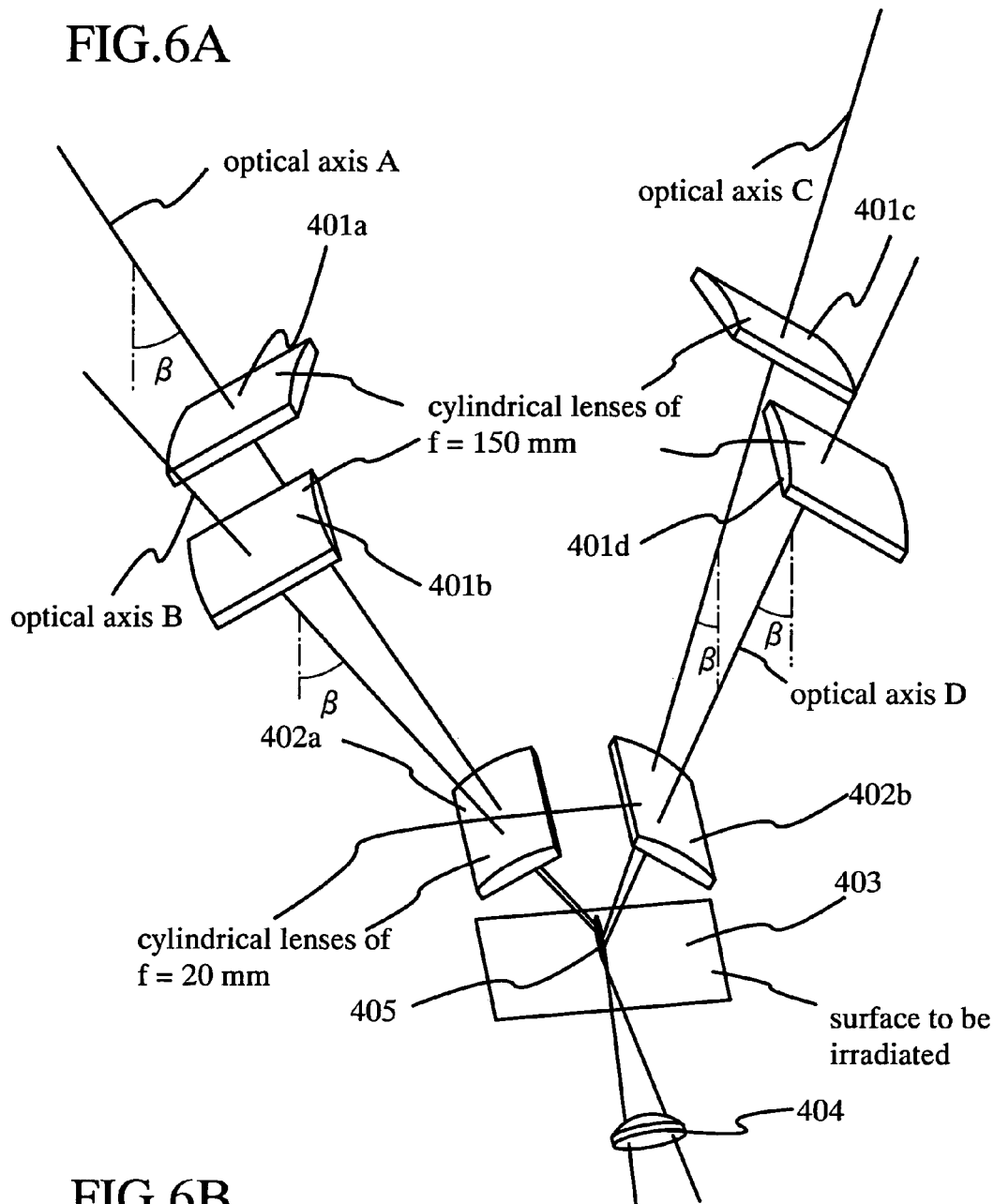
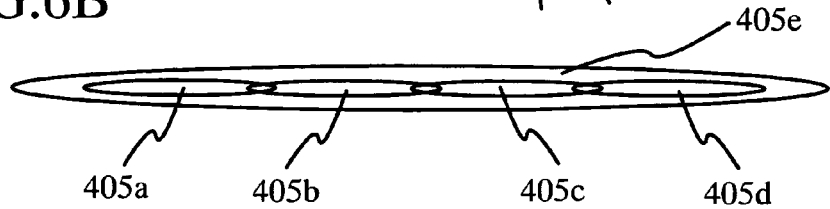

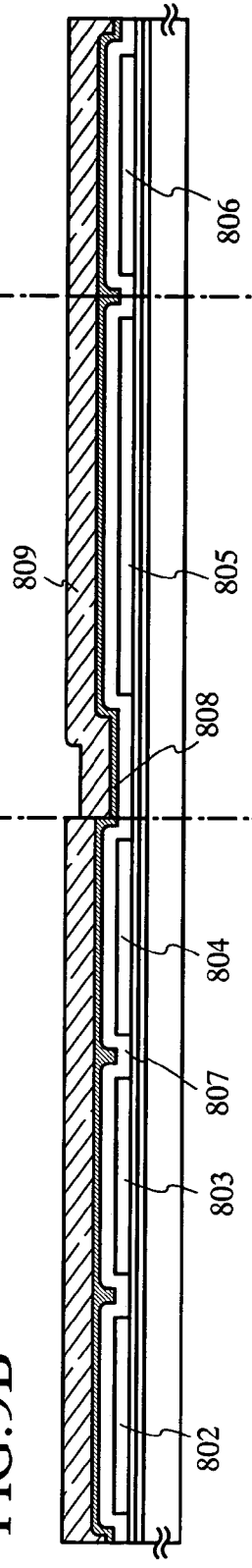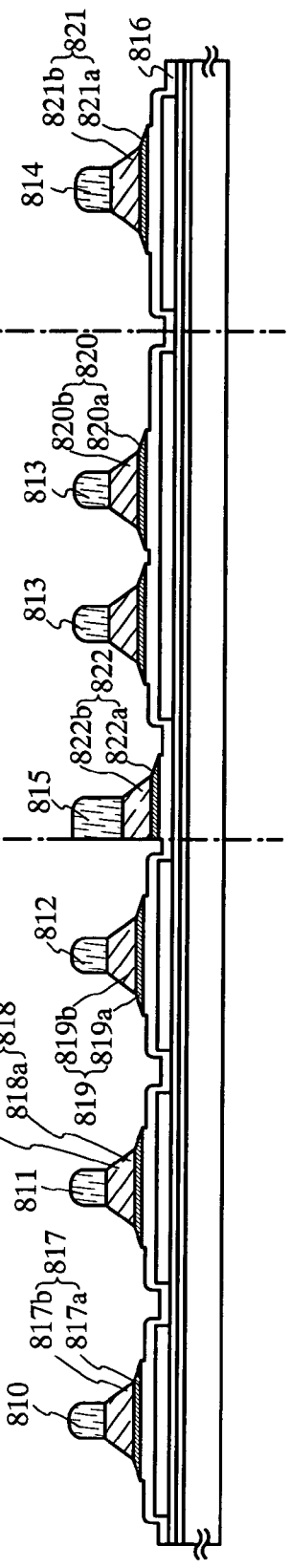

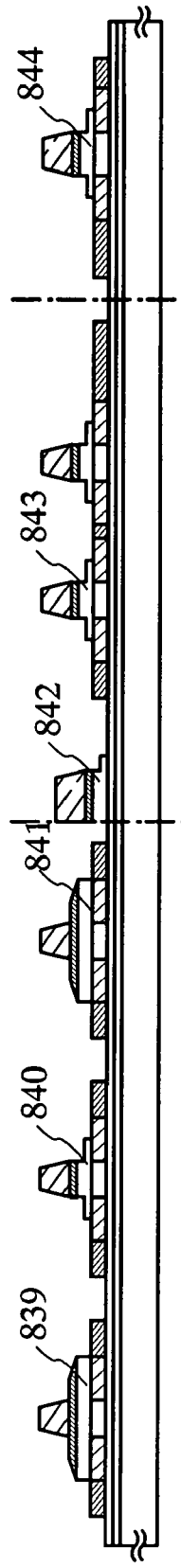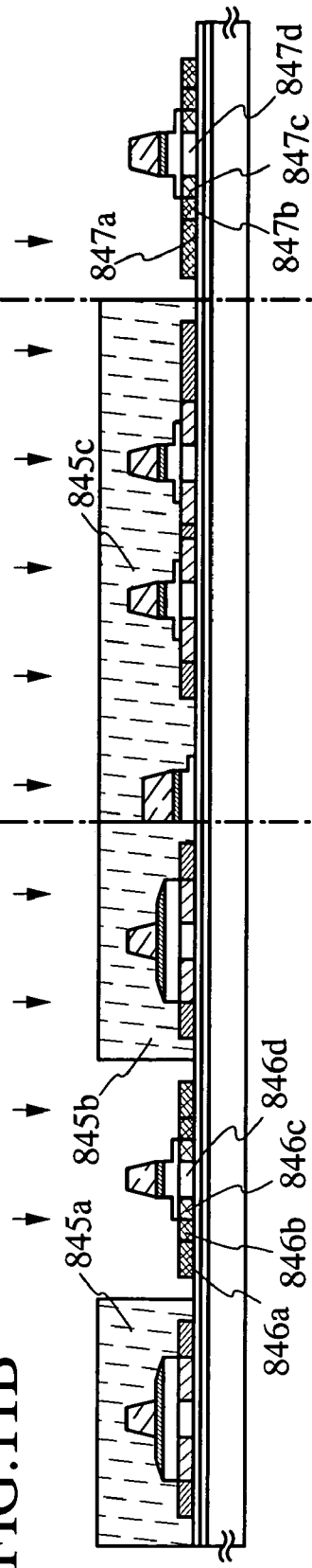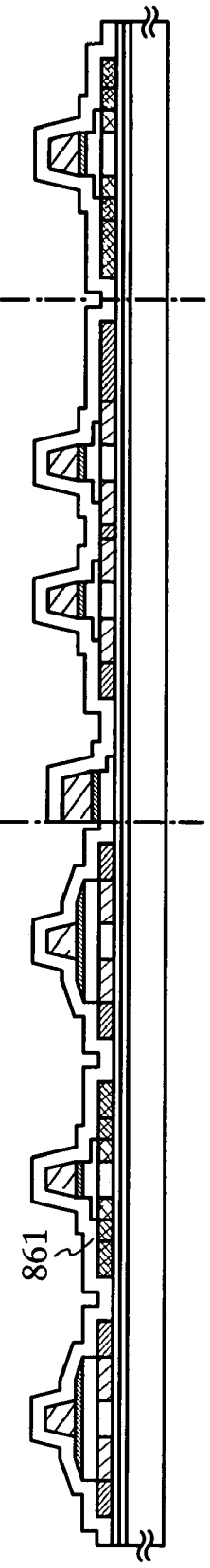

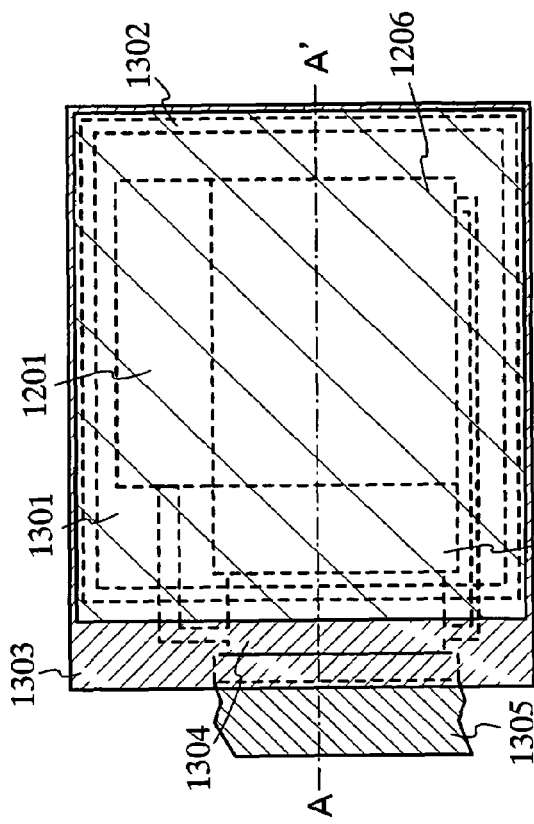
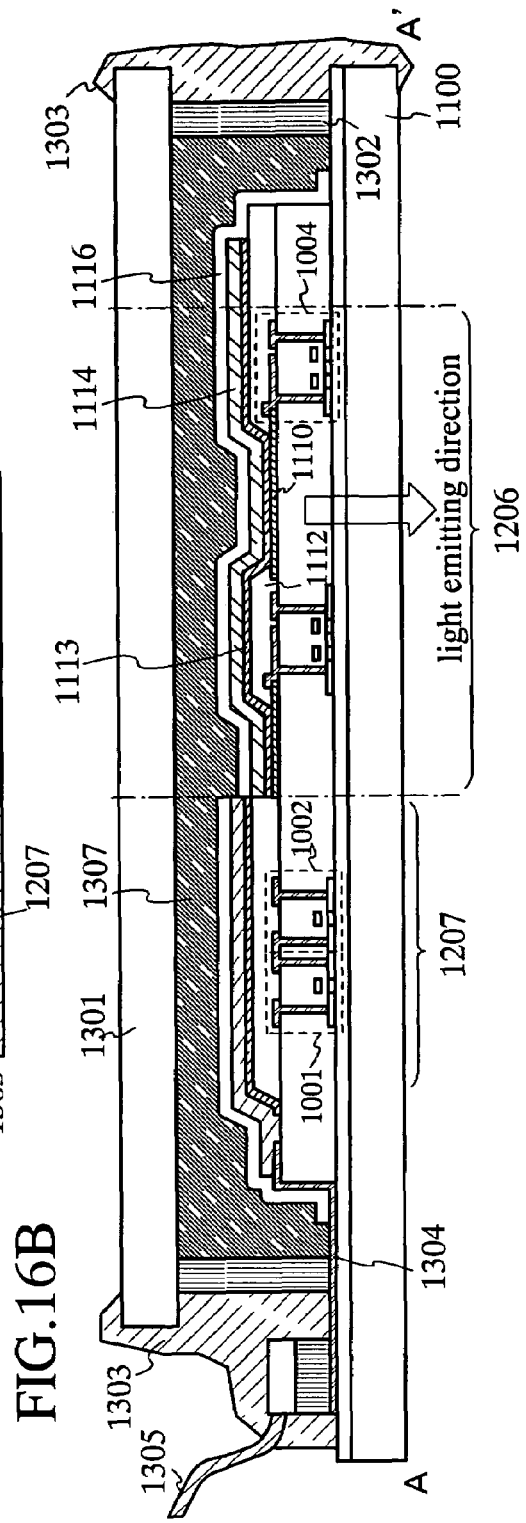
FIG.16A
FIG.16B

LASER IRRADIATION METHOD, LASER IRRADIATION APPARATUS, AND METHOD FOR MANUFACTURING SEMICONDUCTOR DEVICE

BACKGROUND OF THE INVENTION

1. Field of the Invention

The present invention relates to a laser irradiation method and a laser irradiation apparatus for performing the laser irradiation (the laser irradiation apparatus includes a laser oscillator and an optical system to guide a laser beam emitted from the laser oscillator to an object to be irradiated). In addition, the present invention relates to a method for manufacturing a semiconductor device comprising a step of the laser irradiation process. It is noted that the semiconductor device described here includes a general device that can be operated by utilizing the semiconductor characteristic. And thereby an electro-optical device such as a liquid crystal display device, a light-emitting device or the like, and an electronic device having such an electro-optical device as its component are also included in the semiconductor device.

2. Description of the Related Art

In recent years, the technology to form a thin film transistor (hereinafter referred to as TFT) over a substrate makes great progress and application development to an active matrix type semiconductor device has been advanced. Especially TFT with the poly-crystal semiconductor film is superior in field-effect mobility (what is called mobility) to TFT with a conventional amorphous semiconductor film and thereby high-speed operation becomes possible. Therefore, it has been tried to control a pixel by a driver circuit formed on the same substrate as the pixel, which was controlled conventionally by a driver circuit provided outside the substrate.

By the way, a substrate for the semiconductor device is expected to be a glass substrate rather than a single-crystal silicon substrate in terms of its cost. However, a glass substrate is inferior in heat resistance and easy to change in shape when it is heated. Therefore, when TFT with a poly-silicon semiconductor film is formed over a glass substrate, laser annealing is performed to crystallize the semiconductor film in order to prevent the glass substrate from changing in shape due to the heat.

The characteristic of laser annealing is that the processing time can be drastically shortened compared with another annealing method by radiation heating or conductive heating, and that a semiconductor substrate or a semiconductor film on a substrate can be heated selectively and locally so that the substrate will be hardly damaged thermally.

It is noted that the laser annealing method described here includes the technique to recrystallize an amorphous layer or a damaged layer formed over the semiconductor substrate or the semiconductor film, and the technique to crystallize an amorphous semiconductor film formed over the substrate. Moreover, the technique to planarize or modify the surface of the semiconductor substrate or the semiconductor film is also included.

The laser oscillators used for laser annealing are classified broadly into two types, a pulsed laser oscillator and a continuous wave (CW) laser oscillator according to its oscillation system. In recent years, it has been known that in crystallization of the semiconductor film, a crystal grain formed over the semiconductor film becomes larger when using a CW laser oscillator than that when using a pulsed laser oscillator. When the crystal grain formed over the semiconductor film becomes larger, the number of the grain boundaries included in the channel region in TFT formed with this semiconductor film decreases and thereby the mobility becomes higher. As a result, such a semiconductor film can be applied to a high-performance device. For this reason, the CW laser oscillator is beginning to attract attention (US published patent application No. 2002/0031876 A1, for example)

Moreover, in order to enhance the productivity in the process of the laser annealing of the semiconductor or the semiconductor film with the CW laser beam, a method is often employed in which a laser beam emitted from the laser oscillator is shaped into the elliptical laser beam (hereinafter referred to as the elliptical beam), and it is irradiated to the semiconductor or the semiconductor film. The reason why the laser beam is shaped into the elliptical is that the original shape of the laser beam is circular or near-circular.

SUMMARY OF THE INVENTION

When a CW laser oscillator is employed to anneal a semiconductor film, it is expected to manufacture a device with a considerably high characteristic. On the other hand, a beam spot formed with a laser beam having a wavelength sufficiently absorbed in the semiconductor film is extremely small. For example, when a YAG laser is employed, only a laser oscillator that outputs as low as 10 W at the maximum can be employed because the laser beam has to be converted into a harmonic. Therefore, the beam spot on a surface to be irradiated is as small as 500 μm×20 μm approximately at the maximum. And thereby the laser annealing is performed on the necessary region on the surface to be irradiated in such a way that the beam spot having such a size is moved back and forth and side to side on the surface to be irradiated.

FIG. 1A shows an irradiation track by an elliptical beam spot 101 on the semiconductor film. In addition, a reference numeral 105 indicates energy density distribution in a cross-section A of the beam spot 101. In the irradiation track of the beam spot 101 on the semiconductor film, there are formed states of crystals that can be broadly classified into two types. In the regions 102 and 104, there are formed crystal grains similar to crystals crystallized with a pulsed excimer laser. In the region 103, there is formed a state of crystal whose grain size is much larger than that crystallized with a pulsed excimer laser (hereinafter, the state of crystal having such a large grain is referred to as a long crystal grain). More specifically, the long crystal grain formed in the region 103 has a minor axis of several μm and a major axis of several tens μm to several hundreds μm, extending along a scanning direction of the laser beam. An infinite number of such long crystal grains are formed in the region 103 in a packed state. On the other hand, the crystal grains formed in the regions 102 and 104 have a major axis not more than several μm or have a diameter of 1 μm approximately, that is much smaller than that of the long crystal grain. The regions 102 and 104 are formed as an aggregation of such small crystal grains. The small crystal grains formed in the regions 102 and 104 can be assumed as the crystal grains similar to those crystallized with a pulsed excimer laser. Hereinafter, a region in which the crystal grains similar to those crystallized with the pulsed excimer laser are formed is referred to as an inferior crystalline region.

When the crystal grain in the semiconductor film becomes larger, the number of grain boundaries in the channel region of TFT formed with the semiconductor film decreases so that the mobility becomes higher. In addition, the mobility of TFT in the inferior crystalline region is much lower than the mobility of TFT formed in the long crystal grain region. That is to say, there is a big difference between the electric characteristic of TFT formed in the long crystal grain region and that of TFT in the inferior crystalline region. For example, when a semiconductor device such as CPU requiring a high characteristic is manufactured, the semiconductor element cannot be formed in such an inferior crystalline region.

When an elliptical beam with Gaussian energy density distribution is irradiated to the semiconductor film, a proportion of the inferior crystalline region is usually about 20% in the irradiation track. Therefore, since TFT cannot be arranged in 20% of the semiconductor film, this fact becomes a problem in terms of high integration of the semiconductor element. It is an object of the present invention to make the inferior crystalline region formed on the semiconductor film as small as possible.

In the present invention, the fundamental wave having a wavelength of approximately 1 μm is irradiated to the semiconductor film supplimentarily, which is a surface to be irradiated, at the same time the harmonic emitted from the CW laser oscillator is irradiated to it. According to this method, the present invention provides a laser irradiation method, a laser irradiation apparatus and a method for manufacturing a semiconductor device, that make it possible to form the long crystal grain region over the semiconductor film as preventing the inferior crystalline region from being formed.

FIG. 1B is a drawing to explain the content of the present invention. The wavelength band of the beam spot 106 is sufficiently absorbed in the semiconductor film and a reference number 111 indicates energy density distribution of the beam spot 106 in a cross-section B. In FIG. 1B, the energy density A shows a threshold at which the semiconductor melts, and the energy density B shows a threshold at which the long crystal grain region is formed.

In the present invention, a beam spot 107 of the fundamental wave is irradiated supplimentarily as overlapping with the beam spot 106. The fundamental wave having a wavelength of about 1 μm is not absorbed in the semiconductor film in a normal state, but is absorbed well in the melted semiconductor film. Therefore, the fundamental wave is absorbed only in the region irradiated by the beam spot 106 in which the energy density exceeds the threshold A at which the semiconductor melts. That is to say, the energy distribution absorbed in the semiconductor film can be made discontinuous as shown with a full line in FIG. 1B. Therefore, it becomes possible to give only the energy to form the long crystal grain region without giving the energy to form the inferior crystalline region. The energy can be given supplimentarily to the melted semiconductor film so as to form the long crystal grain by shaping the laser beam of the fundamental wave into an elliptical beam or a rectangular beam and irradiating it. In this specification, the elliptical beam and rectangular beam are collectively referred to as a long beam (or an elongated beam). A reference number 112 indicates the energy density absorbed in the semiconductor film when the beam spots 106 and 107 are irradiated.

In the irradiation track formed by the beam spots 106 and 107 in the semiconductor film, there are formed states of crystals that can be broadly classified into two types. The regions 108 and 110 are the inferior crystalline regions, and the region 109 is the long crystal grain region. FIG. 1B shows the irradiation track in which a proportion of the inferior crystalline region is small and a proportion of the long crystal grain region is large compared with the irradiation track shown in FIG. 1A that is formed only by the irradiation of the elliptical beam spot. It is noted that the inferior crystalline region can be eliminated so as to be nearly zero by selecting the conditions appropriately, but cannot be eliminated completely because of the influence of the heat conduction.

As described above, it becomes possible to form the long crystal grain region over the semiconductor film as suppressing the formation of the inferior crystalline region by irradiating the fundamental wave supplimentarily with the harmonic. It is noted that the shape of the beam spot used for the irradiation to the semiconductor film is not limited to the constitution shown in FIG. 1B. A plurality of laser beams of the harmonic may be chained to form a long beam (also called an elongated beam) and be overlapped with the beam spot of the fundamental wave. Moreover, the fundamental wave may be irradiated supplimentarily only to the part forming the inferior crystalline region due to the low energy density. On the contrary, a plurality of the fundamental waves may be used. A combination of a plurality of the fundamental waves with a plurality of the harmonics may be also employed.

The present invention provides a laser irradiation apparatus comprising a first laser oscillator outputting a wavelength not longer than that of visible light, means to shape a first laser beam emitted from the first laser oscillator into a long beam on a surface to be irradiated, a second laser oscillator outputting a fundamental wave, means to irradiate a second laser beam emitted from the second laser oscillator to a part having low energy density in a region where the long beam is irradiated, means to move the surface to be irradiated in a first direction relatively to the first laser beam and the second laser beam, and means to move the surface to be irradiated in a second direction relatively to the first laser beam and the second laser beam.

It is noted that the first direction and the second direction are orthogonalized one another.

In the above structure, it is preferable that a part having high energy density in the second laser beam emitted from the second laser oscillator is irradiated to the part having low energy density in the region where the long beam is irradiated.

In the above structure, the first and second laser oscillators may be selected from the group consisting of a CW gas laser, a CW solid laser and a CW metal laser. An Ar laser, a Kr laser, a $CO_2$ laser and the like are given as the gas laser. A YAG laser, a $YVO_4$ laser, a YLF laser, a $YAlO_3$ laser, a ruby laser, an alexandrite laser, a Ti: Sapphire laser and the like are given as the solid laser. A helium-cadmium laser, a copper vapor laser, a gold vapor laser and the like are given as the metal laser.

It is noted that in the above structure, the first laser beam may be obtained by conversion through a non-linear optical element. A crystal such as LBO, BBO, KDP, KTP, KB5, and CLBO is superior in terms of its conversion efficiency when it is used as a non-linear optical element. The conversion efficiency can be considerably increased by setting such a non-linear optical element into the resonator of the laser oscillator.

In the above structure, it is preferable that the first laser beam is oscillated in $TEM_{00}$ mode because it can enhance the uniformity of the energy of the long beam.

When the annealing is performed to a semiconductor film formed over a substrate transparent to a laser beam, in order to realize uniform irradiation of the laser beam, it is desirable that an incidence angle φ of the laser beam satisfies the inequality of $φ \geq \arctan(W/2d)$. In the equality, it is defined that an incidence plane is perpendicular to the surface to be irradiated and is including a longer side or a shorter side of the laser beam assuming that a shape of the laser beam is rectangular. Moreover, in the inequality, "W" is a length of the longer side or the shorter side included in the incidence plane and "d" is a thickness of the substrate transparent to the laser beam, which is placed at the surface to be irradiated. In the case of using a plurality of laser beams, the inequality needs to be satisfied with respect to each of the plurality of laser beams. It is defined that a track of the laser beam projected to the incidence plane has an incidence angle φ when the track is not on the incidence plane. When the laser beam is made incident at an angle φ, it is possible to perform uniform irradiation of the laser beam without interference of reflected light from a surface of the substrate with reflected light from a rear surface of the substrate. The theory above is considered assuming that a refractive index of the substrate is 1. In fact, the substrate has a refractive index of approximately 1.5, and a larger value than the angle calculated in accordance with the above theory is obtained when the value around 1.5 is taken into account. However, since the laser beam on the surface to be irradiated has energy attenuated at opposite sides in the longitudinal direction thereof, the interference has a small influence on opposite sides and the value calculated in accordance with the inequality is enough to obtain the effect of attenuating the interference.

As the substrate, a glass substrate, a quartz substrate, a silicon substrate, a plastic substrate, a metal substrate, a stainless substrate, a flexible substrate, and the like can be used. As the glass substrate, a substrate of barium borosilicate glass or aluminum borosilicate glass can be given. Besides, the flexible substrate means a membranous substrate such as polyethylene terephthalate (PET), polyethersulfone (PES), polyethylene naphthalate, (PEN), acryl and the like, and weight saving is anticipated when the flexible substrate is used to manufacture a semiconductor device. It is desirable to form a barrier layer such as an aluminum film (for example, AlON, AlN, or AlO), a carbon film (such as a DLC (diamond-like carbon) film), and a SiN film in a single-layer structure or a multi-layer structure on a surface of the flexible substrate or the surface and a rear surface thereof since the property such as durability is enhanced. The inequality with respect to φ is inapplicable to a substrate not transparent to the laser beam because the thickness of the substrate d becomes a meaningless value at all in this case.

The present invention provides a laser irradiation method comprising the steps of shaping a first laser beam having a wavelength not longer than that of visible light into a long beam on a surface to be irradiated, and irradiating a second laser beam having the fundamental wave emitted from a second laser oscillator, simultaneously with the first laser beam to the part having low energy density in the region where the long laser beam is irradiated, wherein irradiation is performed while moving the surface to be irradiated in a first direction relatively to the long beam.

Also, in the laser irradiation method disclosed in this specification, it is preferable to irradiate the part having high energy density in the second laser beam having the fundamental wave emitted from the second laser oscillator to the part having low energy density in the region where the long beam is irradiated.

In the above structure, the first laser beam and the second laser beam are emitted from a CW gas laser, a CW solid laser or a CW metal laser. An Ar laser, a Kr laser, a $CO_2$ laser and the like are given as the gas laser. A YAG laser, a $YVO_4$ laser, a YLF laser, a $YAlO_3$ laser, a ruby laser, an alexandrite laser, a Ti: Sapphire laser and the like are given as the solid laser. A helium-cadmium laser, a copper vapor laser, a gold vapor laser and the like are given as the metal laser.

It is noted that in the above structure, the first laser beam is a harmonic obtained by conversion through a non-linear optical element. A crystal such as LBO, BBO, KDP, KTP, KB5, and CLBO is superior in terms of its conversion efficiency when it is used as a non-linear optical element. The conversion efficiency can be considerably increased by setting such a non-linear optical element into the resonator of the laser oscillator.

In the above structure, it is preferable that the first laser beam is oscillated in $TEM_{00}$ mode because it can enhance the uniformity of the energy of the long beam.

When the annealing is performed to a semiconductor film formed over a substrate transparent to a laser beam, in order to realize uniform irradiation of the laser beam, it is desirable that an incidence angle φ of the laser beam satisfies the inequality of $\phi \geq \arctan(W/2d)$. In the equality, it is defined that an incidence plane is perpendicular to the surface to be irradiated and is including a longer side or a shorter side of the laser beam assuming that a shape of the laser beam is rectangular. Moreover, in the inequality, "W" is a length of the longer side or the shorter side included in the incidence plane and "d" is a thickness of the substrate transparent to the laser beam, which is placed at the surface to be irradiated. In the case of using a plurality of laser beams, the inequality needs to be satisfied with respect to each of the plurality of laser beams. It is defined that a track of the laser beam projected to the incidence plane has an incidence angle φ when the track is not on the incidence plane. When the laser beam is made incident at an angle φ, it is possible to perform uniform irradiation of the laser beam without interference of reflected light from a surface of the substrate with reflected light from a rear surface of the substrate. The theory above is considered assuming that a refractive index of the substrate is 1. In fact, the substrate mostly has a refractive index of 1.5 approximately, and a larger value than the angle calculated in accordance with the above theory is obtained when the value around 1.5 is taken into account. However, since the laser beam on the surface to be irradiated has energy attenuated at opposite sides in the longitudinal direction thereof, the interference has a small influence on the opposite side and the value calculated in accordance with the inequality is enough to obtain the effect of attenuating the interference.

As the substrate, a glass substrate, a quartz substrate, a silicon substrate, a plastic substrate, a metal substrate, a stainless substrate, a flexible substrate, and the like can be used. The inequality with respect to φ is inapplicable to a substrate not transparent to the laser beam because the thickness of the substrate d becomes a meaningless value at all in this case.

The present invention provides a method for manufacturing a semiconductor device comprising the steps of forming a non-single crystal semiconductor film over a substrate, shaping a first laser beam having a wavelength not longer than that of visible light into a long beam on a surface to be irradiated, irradiating a second laser beam having the fundamental wave emitted from a second laser oscillator to the part having low energy density in the region where the long beam is irradiated simultaneously with the first laser beam, moving the surface to be irradiated in a first direction relatively to the long beam while performing irradiation, wherein the laser annealing is thus performed to the non-single crystal semiconductor film.

In the above structure, it is preferable that the part having high energy density in the second laser beam having the fundamental wave emitted from the second laser oscillator is irradiated to the part having low energy density in the region where the long beam is irradiated.

In the above structure, the width of the inferior crystalline region is not more than 15 μm. It is noted that the crystal grain has a diameter of about 1 μm generally in the inferior crystalline region.

In the above structure, the first laser beam and the second laser beam may be emitted from a CW gas laser, a CW solid laser or a CW metal laser. An Ar laser, a Kr laser, a $CO_2$ laser and the like are given as the gas laser. A YAG laser, a $YVO_4$ laser, a YLF laser, a $YAlO_3$ laser, a ruby laser, an alexandrite laser, a Ti: Sapphire laser and the like are given as the solid laser. A helium-cadmium laser, a copper vapor laser, a gold vapor laser and the like are given as the metal laser.

It is noted that in the above structure, the first laser beam is converted into the harmonic through a non-linear optical element. A crystal such as LBO, BBO, KDP, KTP, KB5, and CLBO is superior in terms of its conversion efficiency when it is used as a non-linear optical element. The conversion efficiency can be considerably increased by setting such a non-linear optical element into the resonator of the laser oscillator.

In the above structure, it is preferable that the first laser beam is oscillated in $TEM_{00}$ mode because it can enhance the uniformity of the energy of the long beam.

When the annealing is performed to a semiconductor film formed over a substrate transparent to a laser beam, in order to realize uniform irradiation of the laser beam, it is desirable that an incidence angle φ of the laser beam satisfies the inequality of $\phi \geq \arctan(W/2d)$. In the equality, it is defined that an incidence plane is perpendicular to the surface to be irradiated and is including a longer side or a shorter side of the laser beam assuming that a shape of the laser beam is rectangular. Moreover, in the inequality, "W" is a length of the longer side or the shorter side included in the incidence plane and "d" is a thickness of the substrate transparent to the laser beam, which is placed at the surface to be irradiated. In the case of using a plurality of laser beams, the inequality needs to be satisfied with respect to each of the plurality of laser beams. It is defined that a track of the laser beam projected to the incidence plane has an incidence angle φ when the track is not on the incidence plane. When the laser beam is made incident at an angle φ, it is possible to perform uniform irradiation of the laser beam without interference of reflected light from a surface of the substrate with reflected light from a rear surface of the substrate. The theory above is considered assuming that a refractive index of the substrate is 1. In fact, the substrate has a refractive index of 1.5 approximately, and a larger value than the angle calculated in accordance with the above theory is obtained when the value around 1.5 is taken into account. However, since the laser beam on the surface to be irradiated has energy attenuated at opposite sides in the longitudinal direction thereof, the interference has a small influence on opposite sides and the value calculated in accordance with the inequality is enough to obtain the effect of attenuating the interference.

As the substrate, a glass substrate, a quartz substrate, a silicon substrate, a plastic substrate, a metal substrate, a stainless substrate, a flexible substrate, and the like can be used. The inequality with respect to φ is inapplicable to a substrate not transparent to the laser beam because the thickness of the substrate d becomes a meaningless value at all in this case.

The inferior crystalline region can be minimized by performing the laser annealing to the semiconductor film with the present invention, and a proportion of the long crystal grain can be increased. Therefore, it becomes possible to reduce the region in which TFT cannot be arranged and to highly integrate the semiconductor element. In addition, since the fundamental wave having a wavelength of approximately 1 μm is irradiated to the semiconductor film simultaneously with the harmonic in the present invention, the sudden change in temperature of the semiconductor film can be avoided, and the harmonic having small output can be supported effectively. With these advantages satisfied, the operating characteristic and the reliability of the semiconductor device, typically the active matrix liquid crystal display device, can be enhanced. Moreover, the cost for manufacturing the semiconductor device can be reduced.

BRIEF DESCRIPTION OF THE DRAWINGS

In the accompanying drawings:

FIGS. 6A and 6B are drawings to explain an embodiment mode 3;

FIG. 9A to 9C are sectional views to show a process to manufacture a pixel TFT and TFT of a driver circuit;

FIG. 11A to 11C are sectional views to show a process to manufacture a pixel TFT and TFT of a driver circuit;

FIG. 16A is a top view of a light-emitting device;

FIG. 16B is a sectional view of a driver circuit and a pixel portion of a light-emitting device;

DETAILED DESCRIPTION OF THE PREFERRED EMBODIMENTS

Embodiment Mode 1

Figure 1:
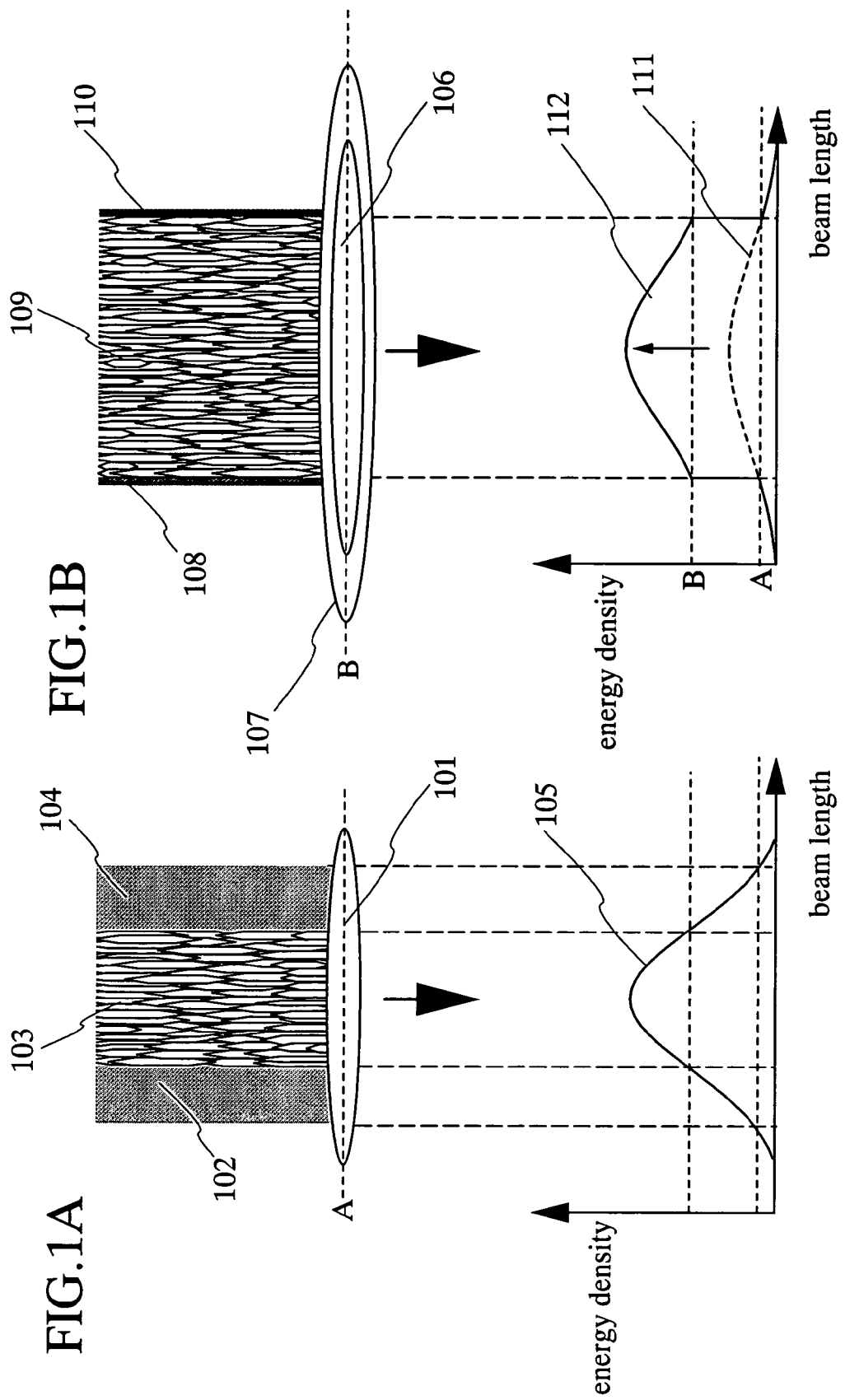
FIGS. 1A and 1B are drawings to show a irradiation track of a beam spot.

The embodiment mode 1 of the present invention is explained with reference to FIG. 2. This embodiment mode explains an example in which long beams 205 and 206 are formed to irradiate a surface of a semiconductor film 204.

First of all, an LD pumped laser oscillator 201 with an output of 10 W (Nd: $YVO_4$ laser, CW, the second harmonic (532 nm)) is prepared. The laser oscillator 201 generates in $TEM_{00}$ mode, and includes LBO crystal in its resonator to convert the laser beam into the second harmonic. The harmonic is not limited to the second harmonic but the second harmonic is superior to the other higher harmonics in terms of the conversion efficiency. The beam diameter is 2.25 mm. The divergence angle is approximately 0.3 mrad. The traveling direction of the laser beam is changed by a 45° reflecting mirror 202 so as to have an angle of φ from the vertical direction. Next, the laser beam is made incident at an angle φ into a planoconvex lens 203 having a focal length of 20 mm whose plane portion corresponds to a horizontal plane. The angle φ may be changed appropriately, and it is set to 20° in this embodiment mode. The semiconductor film 204 is set on a surface to be irradiated in parallel with the horizontal plane.

The semiconductor film 204 is formed over a surface of a glass substrate. A distance between the semiconductor film 204 and the planoconvex lens 203 is set about 20 mm, and the distance is adjusted so as to form the long beam 205 elongated in a direction as parallel as possible to the incidence plane on the semiconductor film 204. The accuracy of fine adjustment is about 50 μm. This forms the long beam 205 whose shape is similar to an ellipse having a major axis of 500 μm and a minor axis of 20 μm.

The substrate on which the semiconductor film 204 is formed is a glass substrate having a thickness of d. It is fixed on a vacuum suction stage 207 so as not to fall. The vacuum suction stage 207 can be operated in XY directions in a plane parallel to the surface of the semiconductor film 204 by a uniaxial robot for X-axis 208 and a uniaxial robot for Y-axis 209. As described above, the equality not to cause interference is $\phi \geqq \arctan(W/2d)$. Therefore, when a substrate has a thickness of 0.7 mm, $\phi \geqq 19.7°$.

Next, a laser oscillator 210 with an output of 300 W (Nd: YAG laser, CW, fundamental wave (1.064 μm), $TEM_{00}$) is prepared. The fundamental wave oscillated from the laser oscillator 210 transmits through an optical fiber 212 and is emitted. The transmission system of the optical fiber 212 is SI type, and it has a core diameter of 0.6 mm. The emitting light from the optical fiber 212 has a NA of 0.2. The emitting light from the optical fiber 212 is condensed with a planoconvex lens 211. The planoconvex lens 211 has a magnification to condense the beam spot into the same size as the diameter of the optical fiber 212. The beam spot at the focal point, which is 170 mm from the planoconvex lens, has a diameter of 0.6 mm. The fundamental wave is made incident into the semiconductor film 204 at an angle θ. The angle θ is set to about 55°, and a beam spot 206 whose shape is similar to an ellipse has a size of 1 mm×0.6 mm. The beam spot 206 is arranged so as to cover the long beam 205.

The fundamental wave having a wavelength of approximately 1 μm is not absorbed in the semiconductor film very much in a normal state, and thereby it is not efficient. However, when the second harmonic is irradiated at the same time, the fundamental wave is much absorbed in the semiconductor film melted by the second harmonic. Thus the annealing efficiency of the semiconductor film becomes better. That is to say, the present invention enables the fundamental wave to be employed in the present process by utilizing the increase in the absorption coefficient due to the liquefaction of the semiconductor film. The advantageous effect is to avoid a sudden change in temperature of the semiconductor film 204, to aid energy to the second harmonic having a small output, and so on. Especially when the fundamental wave diverges in a direction of the minor axis of the long beam 205 of the second harmonic, the change in temperature can be made gradual. Unlike the harmonic, the fundamental wave does not need the non-linear optical element to convert the wavelength, and thereby it is possible to obtain the laser beam having very high output, for example a hundred times or more than the energy of the harmonic. The reason why there is such a difference in energy is that the non-linear optical element does not have enough resistance against the laser beam. In addition, the non-linear optical element to generate the harmonic is easy to change in its quality, and thereby the maintenance-free state, that is one of advantages of the solid laser, cannot be kept long. Therefore, it is very meaningful to aid the harmonic with the fundamental wave according to the present invention.

Next, an example of a method for forming a semiconductor film is described. The semiconductor film is formed over a glass substrate transparent to visible light. Specifically, after forming a silicon oxynitride film having a thickness of 200 nm over one side of a glass substrate having a thickness of 0.7 mm, an amorphous silicon film having a thickness of 66 nm is formed over it with the plasma CVD. Moreover, in order to increase the resistance of the semiconductor film against the laser beam, thermal annealing is performed to the semiconductor film at a temperature of 500° C. for an hour. Instead of the thermal annealing, the semiconductor film may be crystallized with the metal element as described in the related art. In any case, the optimum condition for irradiating the laser beam to the semiconductor film is almost the same.

Figure 3A:
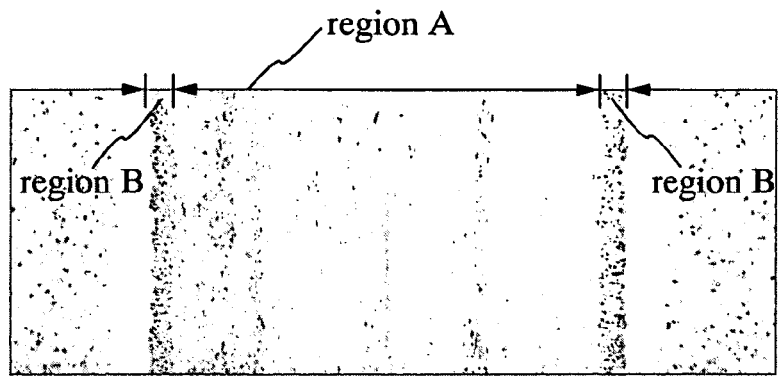
FIG. 3A to 3D are drawings to show the state of the semiconductor film subject to a laser annealing.
Figure 3B:
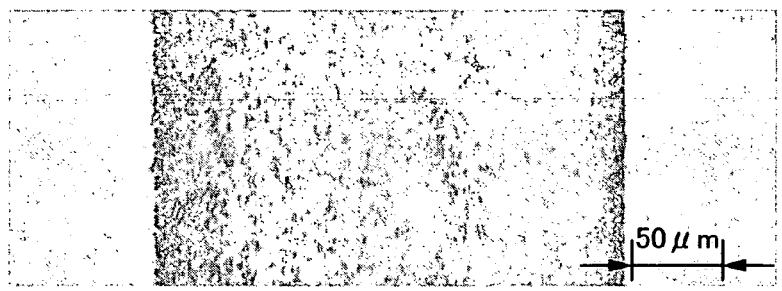

Then, an example of the laser irradiation to the semiconductor film 204 is explained. The output of the laser oscillator 210 is 10 W at the maximum, but the energy is lowered approximately to 9 W because a size of the long beam spot 205 is comparatively small so that the energy density is enough. In addition, a beam spot 206 is formed so as to cover the long beam 205. A length of a minor axis of the beam spot 206 differs by thirty times from that of the beam spot 205. Laser annealing can be performed by scanning the substrate on which the semiconductor film 204 is formed in a direction of the minor axis of the long beam 205 with a uniaxial robot for Y-axis 209. FIG. 3A to 3D show the semiconductor film 204 annealed according to the above method. FIG. 3A is a photograph taken with a transmission microscope under bright-field, and FIG. 3B is a photograph taken with a reflection microscope under dark-field. A long crystal grain region (region A) extending long in a scanning direction is formed in the region having a width of 235 μm in a direction of the major axis of the long beam 205. And the inferior crystalline region (region B) is formed in 15 μm wide at opposite ends of the long crystal grain region (region A). When the substrate is scanned, the fundamental wave is irradiated to the semiconductor film 204 first, and then the second harmonic is irradiated, and the fundamental wave is irradiated again. The fundamental wave is absorbed in the melted silicon, and thereby a sudden change in temperature of the semiconductor film 204 can be avoided.

Figure 3C:
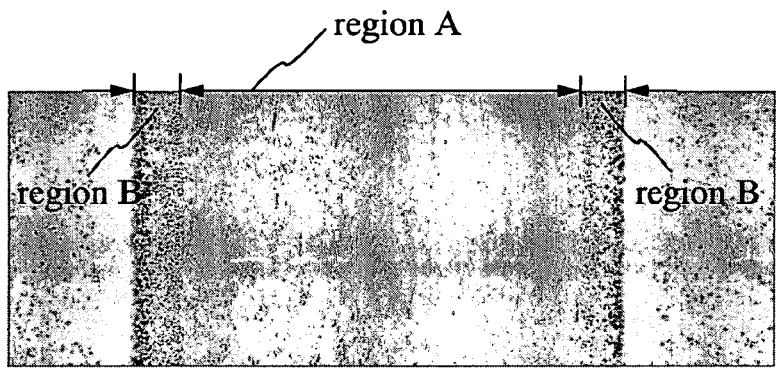
Figure 3D:
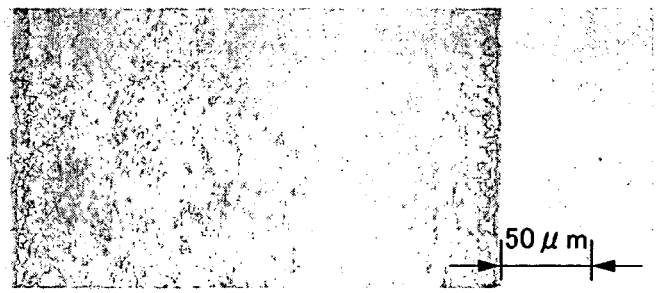

FIGS. 3C and 3D show a semiconductor film annealed when the output of the laser oscillator 201 is set to 10 W and the fundamental wave emitted from the laser oscillator 210 is not irradiated. FIG. 3C is a photograph taken with a transmission microscope under bright-field, and FIG. 3D is a photograph taken with a reflection microscope under dark-field. A long crystal grain region (region A) extending long in a scanning direction is formed in the region having a width of 220 μm in a direction of the major axis of the long beam 205. And the inferior crystalline region (region B) is formed in 25 μm wide at opposite ends of the long crystal grain region (region A). Compared with FIGS. 3A and 3B, the long crystal grain region (region A) is narrowed and the inferior crystalline region is broadened. These results indicate that the method according to the present invention can reduce a proportion of the inferior crystalline region formed at opposite ends of the long crystal grain region. It is noted that opposite ends of the irradiation track in FIGS. 3B and 3D have portions whose surface is very rough (shown with black color in the figures). However, the present invention can perform laser annealing as reducing such portions whose surface is very rough.

It is noted that the laser beam of the harmonic is incident at an angle of 20° or more in this embodiment mode. This can prevent the interference from occurring so as to perform more uniform laser irradiation. The scanning speed is appropriate between several tens cm/s and several hundreds cm/s, and it is set to 50 cm/s here.

Figure 8:
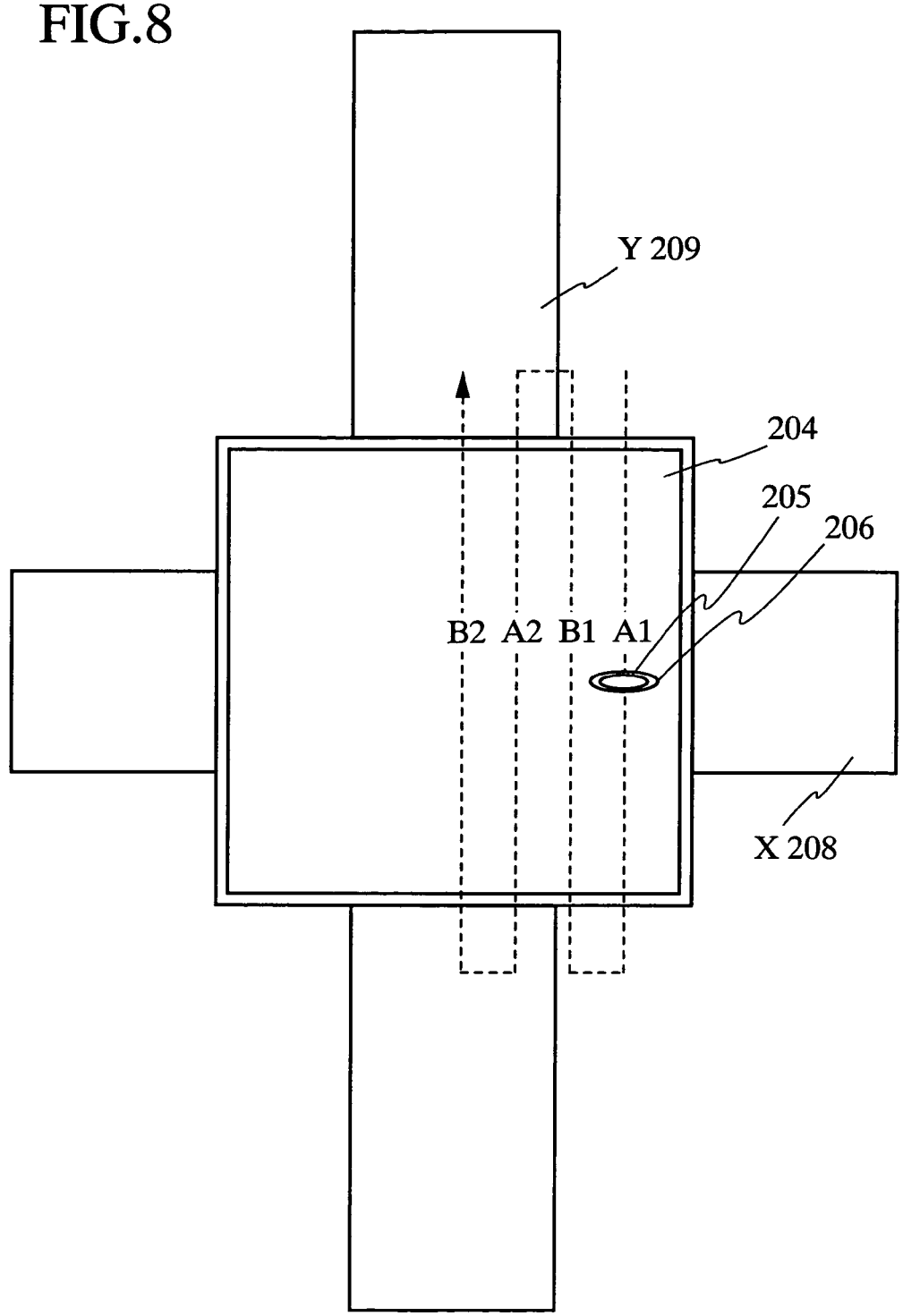
FIG. 8 is a drawing to show an aspect of laser annealing.

FIG. 8 shows a method for irradiation to make a whole surface of the semiconductor film a long crystal grain region.

Figure 2:
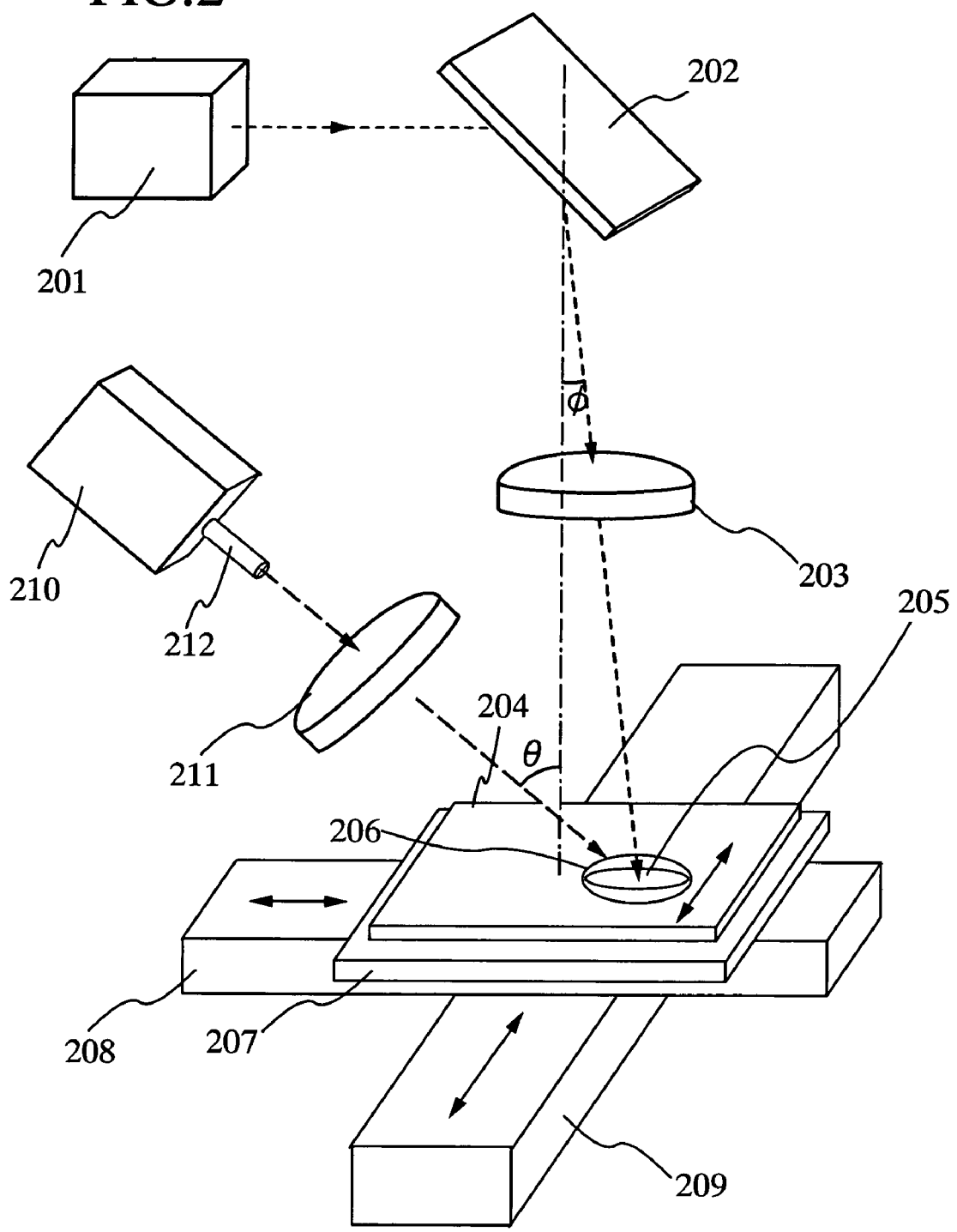
FIG. 2 is a drawing to explain an embodiment mode 1.

In order to make it easier to understand, reference numerals in FIG. 8 are the same as those in FIG. 2. The substrate on which the semiconductor film is formed is fixed on the vacuum suction stage 207, and the laser oscillators 201 and 210 are oscillated. The output is set to 9 W and 30 W respectively. First, the uniaxial robot for Y-axis 209 is used to scan the surface of the semiconductor film in a straight line at a scanning speed of 50 cm/s. The straight line corresponds to a portion of "Al" in FIG. 8. In FIG. 8, after the laser beam is irradiated to a portion of outward "Am" (m is a positive integer) with the uniaxial robot for Y-axis 209, the uniaxial robot for X-axis 208 is used to shift the long beams in the direction of the major axis thereof by the width of the long crystal grain region and the inferior crystalline region, and the laser beam is irradiated to a portion of homeward "Bm". Such round of operation is repeated in order to keep the high proportion of the long crystal grain region all over the semiconductor film. It is noted that the semiconductor film comprising the long crystal grain region has quite superior characteristics. In particular, in the case of manufacturing a semiconductor device such as TFT, the semiconductor device can be expected to show quite high electrical mobility. Conversely, it is unnecessary to form the long crystal grain region in a portion of the semiconductor film not requiring such superior characteristics. Therefore, the laser beam may not be irradiated to such a portion, or irradiation may be performed so as not to form the long crystal grain region. In order to anneal the semiconductor film efficiently not to form the long crystal grain region, the scanning speed may be increased, for example. According to the experiment of the present inventor, when only the long beam 205 is scanned at a speed of 2 m/s approximately, the amorphous silicon film can be crystallized without forming the long crystal grain region, and what is called a poly-silicon film was formed. It is obvious that the above condition depends on the semiconductor film, that is an object to be irradiated, the energy distribution of the laser beam and so on.

Embodiment Mode 2

Figure 4A:
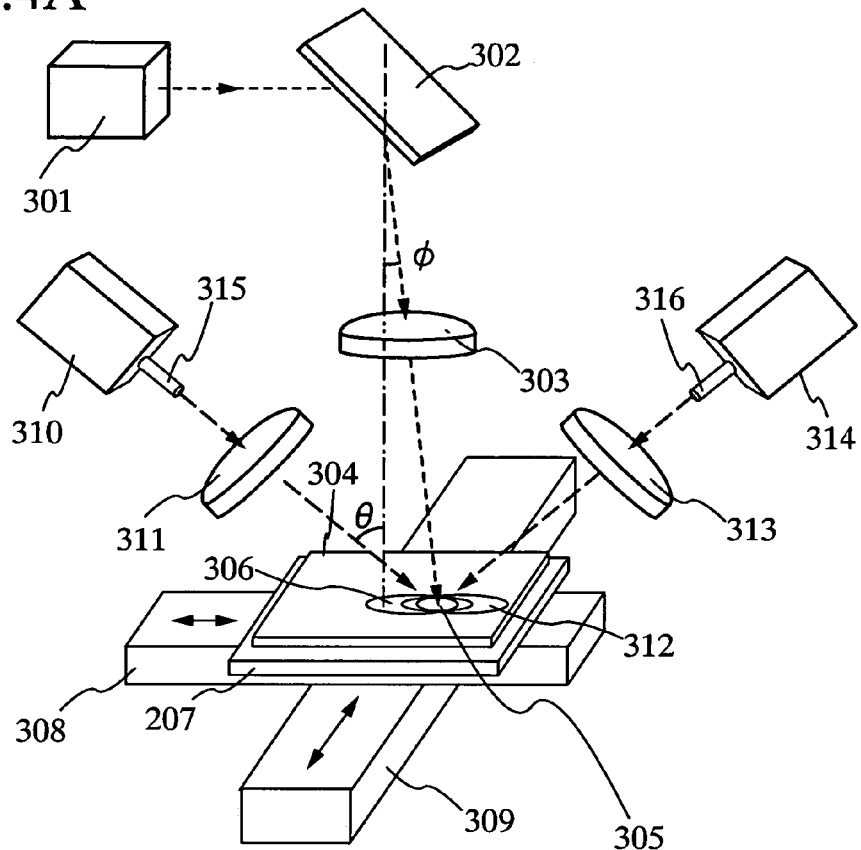
FIGS. 4A and 4B are drawings to explain an embodiment mode 2.
Figure 4B:
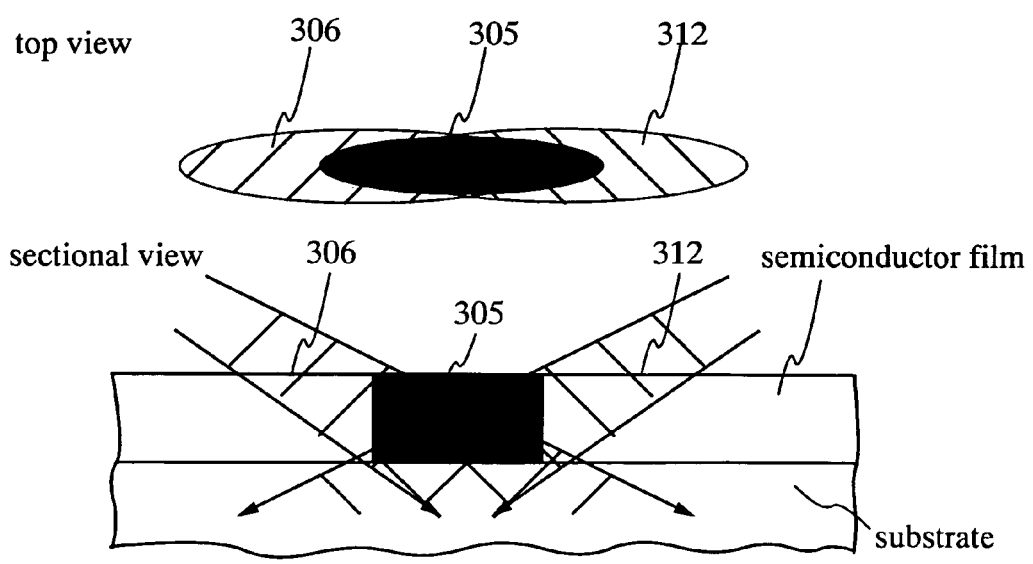

This embodiment mode explains with FIGS. 4A and 4B an example to make the energy distribution of the long beam obtained by shaping the second harmonic shown in embodiment mode 1 more uniform with the fundamental wave.

First, an LD pumped laser oscillator 301 with an output of 10 W (Nd: $YVO_4$ laser, CW, the second harmonic (532 nm)) is prepared. The laser oscillator 301 generates in $TEM_{00}$ mode, and includes LBO crystal in its resonator to convert the laser beam into the second harmonic. The beam diameter is 2.25 mm. The divergence angle is approximately 0.3 mrad. The traveling direction of the laser beam is changed by a 45° reflecting mirror 302 so as to have an angle φ from the vertical direction. Next, the laser beam is made incident at an angle φ into a planoconvex lens 303 having a focal length of 20 mm whose plane portion corresponds to a horizontal plane. The angle φ may be changed accordingly, and it is set to 20° in this embodiment mode. The semiconductor film 304 is set on a surface to be irradiated in parallel with the horizontal plane. The semiconductor film 304 is formed over a surface of a glass substrate. A distance between the semiconductor film 304 and the planoconvex lens 303 is set about 30 mm, and it is adjusted so that the long beam 305 extending in a direction as parallel as possible to the incidence plane is formed on the semiconductor film 304. The accuracy of fine adjustment is about 50 μm. This forms the long beam 305 whose shape is similar to an ellipse having a major axis of 500 μm and a minor axis of 20 μm approximately.

The substrate on which the semiconductor film 304 is formed is a glass substrate having a thickness of d. It is fixed on a vacuum suction stage 307 so as not to fall. The vacuum suction stage 307 can be operated in XY directions on a plane parallel to the surface of the semiconductor film 304 by a uniaxial robot for X-axis 308 and a uniaxial robot for Y-axis 309. As described above, the equality not to cause the interference is φ≧arctan(W/2d). Therefore, when a substrate has a thickness of 0.7 mm, φ≧19.7°.

Next, laser oscillators 310 and 314, both of which output 300 W (Nd: YAG laser, CW, fundamental wave (1.064 μm), $TEM_{00}$) are prepared. The fundamental waves oscillated from the laser oscillators transmit through optical fibers 315 and 316, and are emitted. The transmission system of each optical fiber is SI type, and it has a core diameter of 0.6 mm. The emitted light from the optical fibers has a NA of 0.2. The emitted light from the optical fibers 315 and 316 is condensed with planoconvex lenses 311 and 313 respectively. The planoconvex lenses 311 and 313 have magnification to condense the beam spot into the same size as the diameter of the optical fibers 315 and 316. The beam spot at the focal point, which is 170 mm from the planoconvex lens, has a diameter of 0.6 mm. The fundamental wave is made incident into the semiconductor film 304 at an angle θ. The angle θ is set to about 55° and beam spots 306 and 312 similar to ellipse having a size of 1 mm×0.6 mm are formed on the surface to be irradiated. The beam spots 306 and 312 are arranged so as to cover the long beam 305.

These beam spots are arranged as shown in FIG. 4B, for example. The long beam spots 306 and 312 of the fundamental wave are arranged at opposite sides of the major axis of the long beam spot 305 of the second harmonic in such a way that all the major axes of these long beam spots are disposed in a straight line. Such an arrangement is preferable since the fundamental wave affects directly in attenuating regions at opposite ends of the long beam 305 of the second harmonic, and thus the energy is supplied to make up the shortfall of the energy. Generally the laser beam has Gaussian energy distribution in which the energy is highest in the center of the beam spot, and is attenuated toward opposite sides thereof. Therefore, the energy is lower in opposite ends of the long beam 305 than in its center and this fact affects the uniformity of the laser annealing. When the fundamental wave having higher translucency to the semiconductor film is irradiated to the region melted by the long beam 305 of the second harmonic, the part where the fundamental wave is irradiated in the melted region can be heated selectively.

Figure 5A:
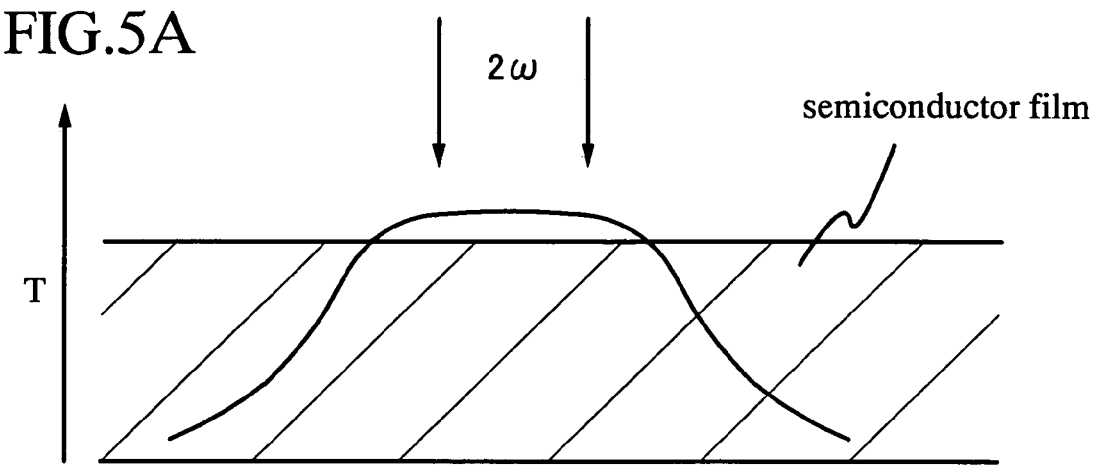
FIGS. 5A and 5B are drawings to explain an embodiment mode 2.
Figure 5B:
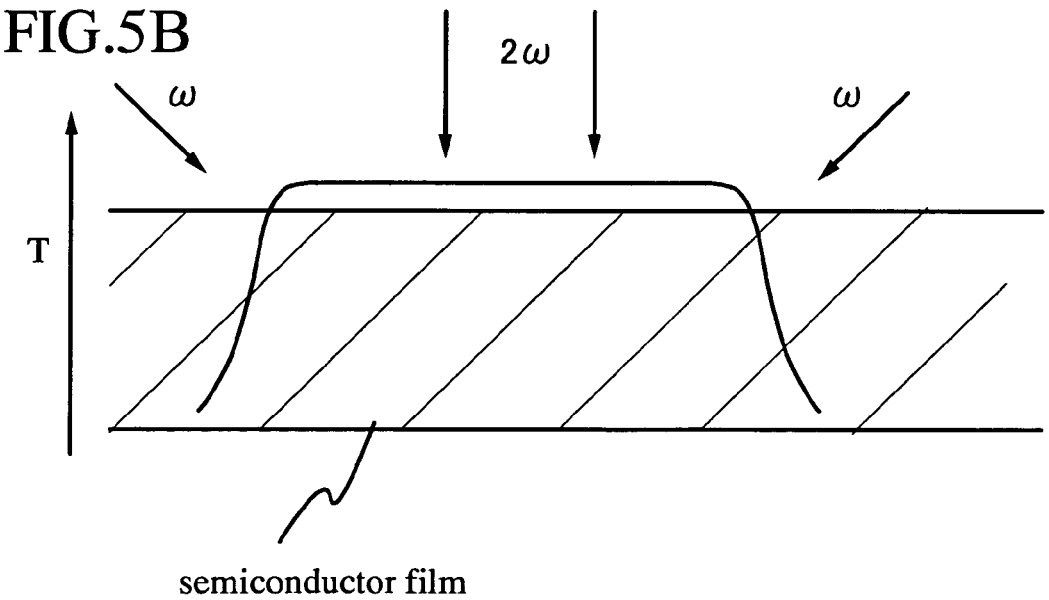

A structure of FIG. 4B is explained with FIGS. 5A and 5B in more detail. In a side view of FIG. 4B, when only the long beam 305 of the second harmonic is employed for laser annealing, the semiconductor film is heated with a temperature distribution as shown in FIG. 5A. Generally the heat is conducted more easily in the melted portion than in the solid portion. Therefore, the energy distribution is uniform in the center of the long beam, but the energy is still attenuated so sharply that the temperature falls in opposite ends of the long beam 305. Since the fundamental wave transmits through the semiconductor film at a high transmissivity, it is possible to irradiate the fundamental wave to this region directly, and thereby the portion in the semiconductor film having uniform temperature distribution can be more increased. That is to say, the temperature distribution in the semiconductor film can be changed into that shown in FIG. 5B by irradiating long beams 306 and 312 from opposite ends of the long beam 305 as shown in a side view of FIG. 4B. In other words, it becomes possible to suppress the variation in temperature of annealing and to increase the portion where the temperature distribution is uniform. In addition, it also becomes possible to decrease the width of the energy attenuation region in opposite ends of the long beam.

Next, an example of the laser irradiation to the semiconductor film 304 is explained. The laser oscillator 301 outputs 10 W at the maximum, but the energy is lowered to approximately 9 W because the size of the long beam spot 305 is comparatively small so that the energy density is enough. And the laser oscillators 310 and 314 output 300 W respectively, and long beams 306 and 312 are arranged so as to cover the long beam 305 from its opposite ends. A length of minor axes of the long beams 306 and 312 differ by ten times compared with that of the long beam 305. However, these beam spots are drawn in the same size in order to make it easier to understand. Even though these beam spots are made in the same size, the content of the present invention does not change. Therefore, the practitioner can choose the beam spot having a size corresponding to the condition such as a film to be used appropriately.

A plurality of single crystals extending long in the scanning direction can be formed in a packed state in a region having a width of 250 μm in the direction of the major axis of the long beam 305 by scanning the substrate on which the semiconductor film 304 is formed in the direction of the minor axis of the long beam 305 with a robot for Y-axis 309. When it is scanned, the fundamental wave is irradiated first to the semiconductor film 304, and then the second harmonic is irradiated, and the fundamental wave is irradiated again. This can prevent temperature of the semiconductor film 304 from changing suddenly. In this case, the laser beam of the harmonic is incident at an angle of 20° or more. By setting the incidence angle as above, the interference can be prevented and thereby more uniform laser irradiation becomes possible. When there is no aid by the long beams of the fundamental wave 306 and 312, the long crystal grain region is as narrow as 190 μm. On the other hand, when there is the aid, the long crystal grain region is as wide as 250 μm approximately. Although the region having uniform temperature distribution is broadened, the part of the laser beam having low energy is still irradiated to opposite ends in the width direction of the long crystal grain region, and thereby the characteristic deterioration in the semiconductor element manufactured in such a portion is concerned. Therefore, it is better not to manufacture a semiconductor element in such a portion. Alternatively, the portion where the characteristic deterioration is concerned may be eliminated by scanning in such a way that the long beam is overlapped in the direction of its major axis. For example, when the region in which the characteristic deterioration is concerned in the long crystal grain region having a width of 250 μm is assumed to be 5 μm in opposite ends respectively, the width of the long crystal grain region that can be used efficiently is 240 μm. Therefore, after crystallizing the semiconductor film 304 with the scanning in one direction by the robot for Y-axis 209, the robot for X-axis is moved for 245 μm, and then the scan with the robot for Y-axis 209 is again performed to form the long crystal grain region. By repeating such scannings, it is possible to minimize the proportion of the region in which the characteristic deterioration is concerned in the substrate.

Embodiment Mode 3

This embodiment mode explains an example in which several long beams obtained by shaping the second harmonics are combined to form a longer beam, and moreover, it is aided with the energy of the fundamental wave with FIGS. 6A and 6B.

First, four LD pumped laser oscillators (not shown in the figure) with an output of 10 W (Nd: $YVO_4$ laser, CW, the second harmonic (532 nm)) are prepared. The laser oscillators generate in $TEM_{00}$ mode and the laser beams emitted from these laser oscillators are converted into the second harmonics through LBO crystal included in their resonators. The beam diameter is 2.25 mm. The divergence angle is 0.3 mrad approximately. Several reflecting mirrors are used in order to change traveling directions of the respective laser beams so as to have an angle β to the vertical direction, and the laser beams are made incident into a surface to be irradiated from four directions so as to be combined into nearly one at the surface to be irradiated. The four directions are corresponded to optical axes A, B, C, and D respectively. The optical axes A and B (also the optical axes C and D) are positioned plane-symmetrically to plane A that is perpendicular to the surface to be irradiated, and an angle made by the optical axes A and B (also an angle made by the optical axes C and D) is set to 20°. In addition, the optical axes A and C (also the optical axes B and D) are positioned plane-symmetrically to plane B that is perpendicular to the plane A and the surface to be irradiated, and an angle made by plane C including the optical axes A and B, and plane D including the optical axes C and D is set to 50°.

Then, planoconvex cylindrical lenses 401a, 401b, 401c, and 401d, each having a focal length of 150 mm, are arranged so that the optical axes A, B, C, and D are incident thereinto at an angle of 0° respectively. On this occasion, condensing directions of the planoconvex cylindrical lenses are the directions included in the plane C or plane D. A distance between the surface to be irradiated and each of the planoconvex cylindrical lenses 401a to 401d is adjusted between 110 mm and 120 mm when measured along the optical axes respectively.

Further, planoconvex cylindrical lenses 402a and 402b, having a focal length of 20 mm are arranged so that their generating lines are included in the planes C and D respectively. The generating line described here is defined as the generating line located at a curved portion of the cylindrical lens, which is the farthest from the plane portion of the cylindrical lens. The plane portion of the planoconvex cylindrical lens 402a and the plane C are orthogonalized each other, and the plane portion of the planoconvex cylindrical lens 402b and the plane D are orthogonalized each other. A distance between the surface to be irradiated and each of the planoconvex cylindrical lenses 402a and 402b is adjusted so as to be 18 mm approximately when measured along the optical axes respectively.

With the arrangement described above, four long beams each having a size of 400 μm in a major axis and 20 μm in a minor axis are formed on the surface to be irradiated. If nothing is done, the four long beams are combined into one perfectly on the surface to be irradiated without forming a longer beam. However, when the positions of the respective lenses are fine adjusted, the arrangement of the four long beams is changed as shown in FIG. 6B. That is to say, the major axes of the four long beams 405a to 405d are arranged in a straight line and the beams are shifted each other in the direction of their major axes to form a longer beam out of the four long beams. In this way, a long crystal grain region having a width of 1.5 mm can be obtained.

Then, a laser beam emitted from an LD pumped CW YAG laser (fundamental wave) with an output of 2000 W is shaped into an elliptical beam 405e having a size of 1 mm×2 mm on the surface to be irradiated through an optical system 404. On this occasion, the elliptical beam 405e is formed so as to cover the four long beams. The optical system 404 may be constituted so that the laser beam is incident obliquely as the plano-convex lens 203 shown in FIG. 2, for example. Alternatively, two orthogonal cylindrical lenses may be used to shape a round beam into the elliptical beam. What is important here is that the fundamental wave must not be returned to the laser oscillator. Since the fundamental wave is reflected somewhat on a surface of a semiconductor film, the laser beam must not be made incident vertically into the surface to be irradiated.

Thus formed long beam may be used to crystallize the whole surface of the semiconductor film, for example with the uniaxial robot for X-axis 208 and the uniaxial robot for Y-axis 209 shown in Embodiment Mode 1. The semiconductor film may be formed, for example in accordance with the method described in Embodiment Mode 1. This embodiment mode gives advantages that the longer beam can shorten processing time and the energy distribution is homogenized in the direction of its major axis because the long beams with Gaussian energy distribution are overlapped with each other contiguously, which makes it possible to suppress the variation in temperature comparatively.

Embodiment Mode 4

Figure 7:
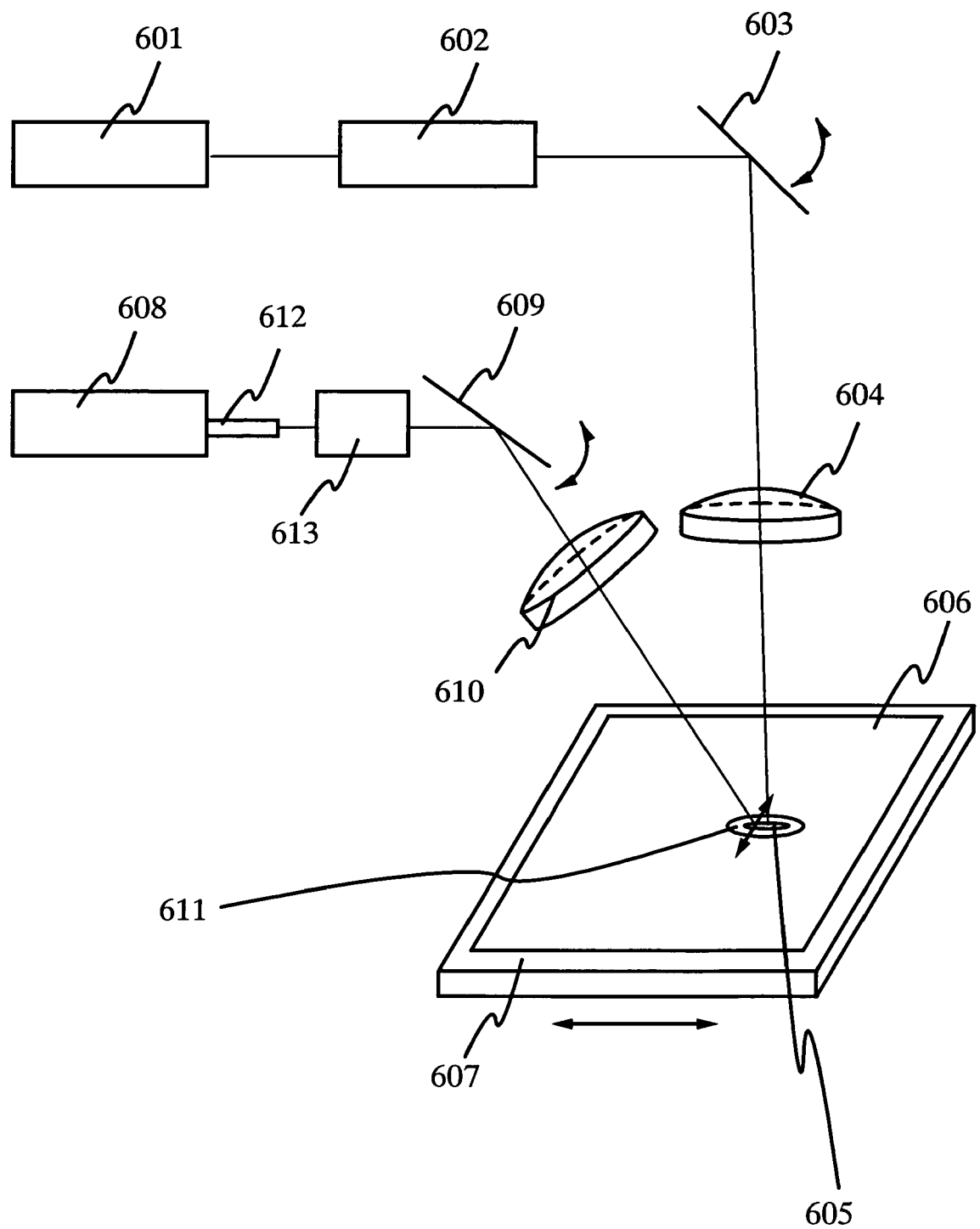
FIG. 7 is a drawing to explain an embodiment mode 4.

This embodiment mode explains with FIG. 7 an example in which the long beam obtained by shaping the second harmonic is irradiated with deflecting means such as a galvanometer mirror, and in addition, the laser beam of the fundamental wave is irradiated with deflecting means such as a galvanometer mirror in order to aid the energy.

First, an LD pumped laser oscillator 601 with an output of 10 W (Nd: $YVO_4$ laser, CW, the second harmonic (532 nm)) is prepared. The laser oscillator 601 generates a laser beam in $TEM_{00}$ mode and the laser beam is converted into the second harmonic by LBO crystal included in its resonator. The beam diameter is 2.25 mm and the divergence angle is 0.3 mrad approximately. Since this beam is circular, it is made incident into an optical system 602 in order to shape it into oblong. A beam expander including two cylindrical lenses may be used as the shaping means, and the beam may be extended only in one direction to shape it into elliptical. Alternatively, a general beam expander may be combined with the above beam expander in order to control the divergence angle. Next, the laser beam shaped into elliptical is deflected by a galvanometer mirror 603. The deflected laser beam reaches a plane formed of a semiconductor film 606 through an fθ lens 604. The elliptical laser beam is condensed on the plane through the fθ lens 604. This makes a long beam 605 having a size of 20 μm in a minor axis, and 400 μm in a major axis formed on the plane. The long beam 605 is scanned on the plane by changing an angle of the galvanometer mirror 603. The fθ lens 604 can prevent a shape of the long beam 605 from changing due to the angle of the galvanometer mirror. The incidence angle of the laser beam to the semiconductor film 606 is set to 20°. This can prevent the interference between the reflected light from the surface of the semiconductor film 606 and the reflected light from the rear surface of the substrate on which the semiconductor film 606 is formed.

In order to irradiate the fundamental wave to the semiconductor film 606 in accordance with the long beam 605 formed with the second harmonic, an LD pumped YAG laser 608 with an output of 300 W (Nd: YAG laser, CW, fundamental wave (1.064 μm), $TEM_{00}$, the divergence angle is about 3 mrad) is prepared. The fundamental wave oscillated from the laser oscillator transmits through an optical fiber 612 and is emitted. The transmission system of the optical fiber is SI type, and it has a core diameter of 0.6 mm. The light emitted from the optical fiber has a NA of 0.2. The emitting light from the optical fiber is collimated through an optical system 613 including a collimator lens or the like. The collimated laser beam is deflected to the direction of the semiconductor film 606 by a galvanometer mirror 609. The deflected laser beam reaches a plane formed with the semiconductor film 606 through an fθ lens 610. The fθ lens condenses the laser beam on the plane so as to form the laser beam 611 having a size of 600 μm in a minor axis and 1 mm in a major axis, for example. The laser beam 611 is scanned on the plane by changing the angle of the galvanometer mirror 609. The galvanometer mirror 609 is operated so as to be synchronized with the galvanometer mirror 603. And the laser beam 611 is scanned in accordance with the position of the long beam 605 of the second harmonic. The fθ lens 610 can prevent a shape of the long beam 611 from changing due to the angle of the galvanometer mirror. The incidence angle of the laser beam to the semiconductor film 606 is set to 55° approximately. This can prevent the interference between the reflected light from the surface of the semiconductor film 606 and the reflected light from the rear surface of the substrate on which the semiconductor film 606 is formed.

In this embodiment mode, the galvanometer mirrors 603 and 609 each of which comprises one mirror are scanned in only one direction. Since the whole two-dimensional plane cannot be scanned with these galvanometer mirrors, the substrate is mounted on a uniaxial stage 607 that is operated in right-and-left direction on the sheet of FIG. 7 so that the whole surface of the substrate can be annealed. The scanning speed of the long beam 605 ranges from 100 mm/s to 2000 mm/s, preferably at 500 mm/s approximately.

In order to anneal the whole surface of the semiconductor film 606, the following operation may be performed repeatedly, for example. After the galvanometer mirrors 603 and 609 are operated in a half cycle, the uniaxial stage 607 is moved by a width of the long crystal grain region, and then the galvanometer mirrors 603 and 609 are operated in a half cycle again. In this embodiment mode, the long crystal grain region has a width of 235 μm approximately and the uniaxial stage 607 is moved by its width sequentially.

It is noted that although this embodiment mode explained a constitution in which the laser beam of the fundamental wave is scanned by the galvanometer mirror, the optical fiber and the optical system may be operated relatively to the substrate so that the laser beam of the fundamental wave is irradiated in the same position as that of the second harmonic without using the galvanometer mirror.

Embodiment 1

This embodiment explains a method for manufacturing an active matrix substrate with FIG. 9A to 10C.

Initially, a substrate 700 comprising a glass such as a barium borosilicate glass, aluminoborosilicate glass or the like, typically #7059 glass, #1737 glass or the like manufactured by Corning, Inc. is prepared. It is noted that a quartz substrate, a silicon substrate, a metal substrate, or a stainless substrate, on which an insulating film is formed can be also used as the substrate 700. Moreover, a plastic substrate that can resist against the heat generated in the processes in this embodiment can be used.

Next, an insulating film such as a silicon oxide film, a silicon nitride film, a silicon oxynitride film or the like is formed on a substrate 700 as a base film 701. In this embodiment, the base film 701 is formed in a two-layer structure, but it may be formed in a single-layer structure or in a laminated-layer structure of two or more layers. As a first layer of the base film 701, a silicon oxynitride film 701a is formed in the range of 10 nm to 200 nm (preferably from 50 nm to 100 nm) in thickness by plasma CVD with $SiH_4$, $NH_3$, and $N_2O$ as reactive gas. In this embodiment, a silicon oxynitride film 701a (composition ratio: Si=32%, O=27%, N=24%, H=17%) having a thickness of 50 nm is formed. Then a silicon oxynitride film 701b is formed in the range of 50 nm to 200 nm (preferably from 100 nm to 150 nm) in thickness by the plasma CVD with $SiH_4$ and $N_2O$ as reactive gas. In this embodiment, the silicon oxynitride film 701b (composition ratio: Si=32%, O=59%, N=7%, H=2%) having a thickness of 100 nm is formed.

Next, a semiconductor film 702 is formed on the base film. The semiconductor film 702 having an amorphous structure is formed in the range of 25 nm to 80 nm (preferably from 30 nm to 60 nm) in thickness by a known method (such as sputtering, LPCVD, plasma CVD or the like). The material for the semiconductor film is not limited, but it is preferable to use silicon or silicon germanium (SiGe) alloy. Next, a crystalline semiconductor film obtained by performing the laser crystallizing method is patterned in a desired shape so as to form semiconductor layers 802 to 806. Not only the laser annealing method, but also it may be combined with other known crystallizing methods (such as RTA, thermal crystallizing method using the annealing furnace, thermal crystallizing method using catalyst such as nickel and the like).

When the crystalline semiconductor film is formed with the laser crystallizing method, a CW laser such as YAG laser, $YVO_4$ laser, YLF laser, $YAlO_3$ laser, ruby laser, Ti: Sapphire laser and the like can be used. When these lasers are used, it is preferable to employ a method to condense a laser beam emitted from the laser oscillator into rectangle or elliptical through an optical system and to irradiate it to the semiconductor film. The condition in crystallization is selected by a practitioner appropriately.

The plasma CVD is employed in this embodiment to form an amorphous silicon film in 55 nm thick. And the crystalline silicon film is formed by the laser crystallizing method with the fundamental wave emitted from the CW YAG laser and the second harmonic emitted from the CW $YVO_4$ laser. And this crystalline silicon film is patterned with photolithography method to form semiconductor layers 802 to 806.

After the semiconductor layers 802 to 806 are formed, a small amount of impurities (boron or phosphorous) may be doped in order to control the threshold of TFT.

Next, a gate insulating film 807 is formed to cover the semiconductor layers 802 to 806. The gate insulating film 807 is formed of an insulating film including silicon having a thickness ranging from 40 nm to 150 nm with the plasma CVD or the sputtering. In this embodiment, the gate insulating film 807 is formed of a silicon oxynitride film (composition ratio: Si=32%, O=59%, N=7%, H=2%) having a thickness of 110 nm with the plasma CVD. Of course, the gate insulating film may be formed of not only the silicon oxynitride film, but also other insulating film including silicon in a single-layer structure or in a laminated-layer structure.

And when a silicon oxide film is used, it is formed by the plasma CVD with a mixture of TEOS (Tetraethyl Orthosilicate) and $O_2$, at a reaction pressure of 40 Pa, with a substrate temperature set in the range of 300° C. to 400° C., and by discharging at a high frequency (13.56 MHz) with an electric density ranging from 0.5 W/cm$^2$ to 0.8 W/cm$^2$. Thus manufactured silicon oxide film gives a good characteristic as the gate insulating film by a thermal annealing at a temperature ranging from 400° C. to 500° C. thereafter.

Next, a first conductive film 808 having a thickness ranging from 20 nm to 100 nm and a second conductive film 809 having a thickness ranging from 100 nm to 400 nm are formed in a laminated-layer structure on the gate insulating film 807. In this embodiment, the first conductive film 808 including a TaN film having a thickness of 30 nm, and the second conductive film 809 including a W film having a thickness of 370 nm were formed in a laminated-layer structure. The TaN film was formed with the sputtering, using Ta as a target in the atmosphere of nitrogen. And the W film was formed with the sputtering, using W as a target. Instead of the sputtering, the W film can be also formed with thermal CVD using tungsten hexafluoride ($WF_6$). In any way, in order to use it as a gate electrode, it is necessary to make it low resistant, and thereby it is preferable to make the resistivity of the W film not more than 20 μΩcm. The W film can be made low resistant by enlarging its crystal grain, but when the W film includes a large amount of impurities such as oxygen, the crystallization is disturbed, and as a result it becomes high resistant. Therefore, in this embodiment, the W film was formed with the sputtering using high-purity W (purity 99.99%) as a target, and moreover very careful attention was paid when forming the W film so that the impurities in the air may not incorporated into it. Thus, it became possible to make its resistivity between 9 μΩcm and 20 μΩcm.

It is noted that in this embodiment, the first conductive film 808 was formed of TaN, the second conductive film 809 was formed of W, but they are not limited to these elements. Both of the conductive films may be formed of the elements selected from the group consisting of Ta, W, Ti, Mo, Al, Cu, Cr and Nd, or of a chemical compound material or an alloy material including the above element as its main component. In addition, the semiconductor film, typically a crystalline silicon film, doped with the impurities such as phosphorus may be employed. Moreover, AgPdCu alloy can be also used. In addition, these conductive films may have a structure in which the first conductive film is formed of a tantalum (Ta) film and the second conductive film is formed of a W film, a structure in which the first conductive film is formed of a titanium nitride (TiN) film and the second conductive film is formed of a W film, a structure in which the first conductive film is formed of a tantalum nitride (TaN) film and the second conductive film is formed of an Al film, or a structure in which the first conductive film is formed of a tantalum nitride (TaN) film and the second conductive film is formed of a Cu film.

Next, the photolithography method is employed to form masks made of resist 810 to 815, and a first etching process is performed to form electrodes and wirings. The first etching process is performed in accordance with first and second etching conditions. An ICP (Inductively Coupled Plasma) etching method was employed as the first etching condition in this embodiment. The etching process was performed under the first etching condition in which $CF_4$, $Cl_2$ and $O_2$ were used as the etching gas at a gas flow rate 25:25:10 (sccm) respectively, and plasma was generated by applying 500 W RF (13.56 MHz) electric power to a coil shaped electrode at a pressure of 1.0 Pa. In this process, dry-etching device using ICP manufactured by Matsushita Electric Industrial Co., Ltd. (Model E645-☐ICP) was used. 150 W RF (13.56 MHz) electric power is also applied to the substrate side (sample stage), and thereby substantially a negative self-bias voltage is impressed. The W film is etched under the first etching condition, and the edge portions of the first conductive layer are made into a tapered shape.

Next, the etching process was performed under the second etching condition without removing the masks made of resist 810 to 815. In the second etching condition, $CF_4$ and $Cl_2$ were used as the etching gas at a gas flow rate 30:30 (sccm) and plasma was generated by applying 500 W RF (13.56 MHz) to a coil shaped electrode at a pressure of 1.0 Pa. Then the etching process is performed for about 30 seconds. 20 W RF (13.56 MHz) electric power is also applied to the substrate side (sample stage), and thereby substantially a negative self-bias voltage is impressed. Under the second etching condition using the mixed gas of $CF_4$ and $Cl_2$, the W film and the TaN film are both etched to the same extent. It is noted that in order to perform the etching process without leaving a remnant on the gate insulating film, the time for etching is increased by 10% to 20%.

In the first etching process described above, the end portions of the first and second conductive layers are made into tapered shape due to the bias voltage impressed to the substrate side by optimizing the shape of the masks made from resist. And the tapered portions has an angle in the range of 15° to 45°. Thus first shaped conductive layers 817 to 822 (the first conductive layers 817a to 822a and the second conductive layers 817b to 822b) including the first conductive layer and the second conductive layer are formed. A reference number 816 is a gate insulating film. And a region not covered with the first shaped conductive films 817 to 822 is etched from 20 nm to 50 nm approximately.

Figure 10A:
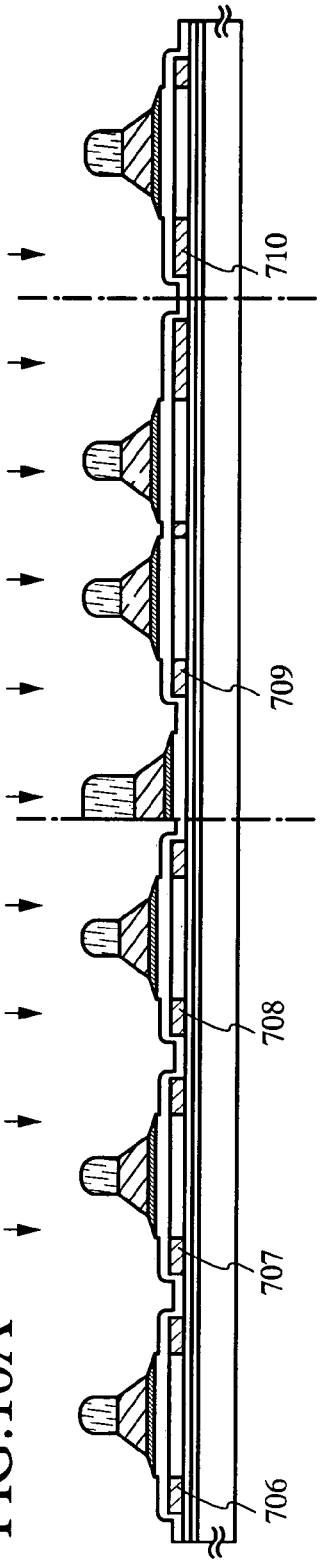
FIG. 10A to 10C are sectional views to show a process to manufacture a pixel TFT and TFT of a driver circuit.

Then a first doping process is performed without removing the masks made from resist. The impurity element imparting n-type is doped in the crystalline semiconductor layer through this process (FIG. 10A). The first doping process may be performed by an ion doping or an ion implantation. The ion doping is performed under the condition in which the dosage ranges from $1\times10^{13}/cm^2$ to $5\times10^{15}/cm^2$, and the acceleration voltage ranges from 60 keV to 100 keV. In this embodiment, the dosage was set to $1.5\times10^{15}/cm^2$ and the acceleration voltage was set to 80 keV. The 15th element in the periodic table, typically phosphorus (P) or arsenic (As) is used as an impurity element imparting n-type. Phosphorus (P) was used in this embodiment. In such a case, first high-concentration impurity regions 706 to 710 are formed in a self-aligning manner by using the conductive layers 817 to 821 as the masks against the impurities imparting n-type. The impurities imparting n-type are doped in the first high-concentration impurity regions 706 to 710 at a concentration ranging from $1\times10^{20}/cm^3$ to $1\times10^{21}/cm^3$.

Next, a second etching process is performed without removing the masks made from resist. The second etching process is performed under the condition in which $CF_4$, $Cl_2$ and $O_2$ are used as the etching gas to etch the W film selectively. Through the second etching process, the second conductive layers 828b to 833b are formed. On the other hand, the first conductive layers 817a to 822a are hardly etched, and thereby second shaped conductive layers 828 to 833 are formed.

Figure 10B:
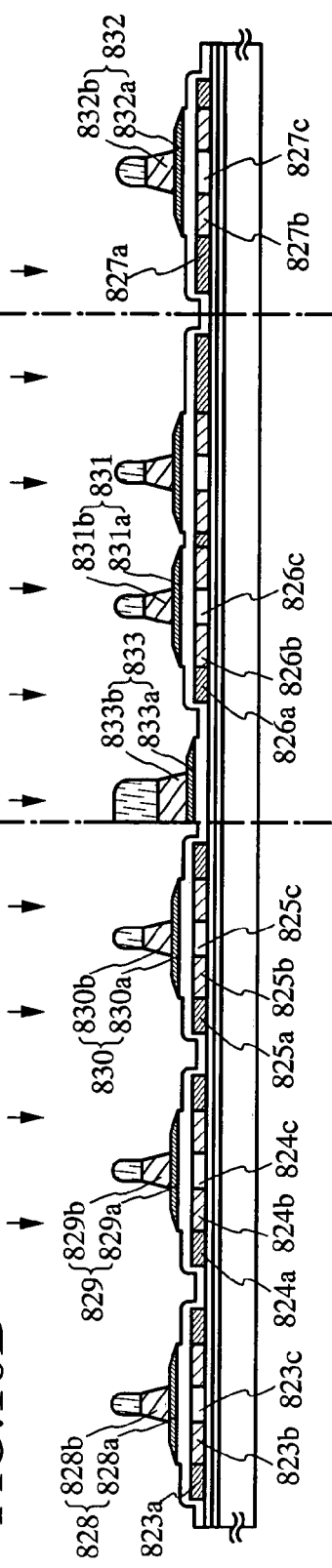

A second doping process is performed as shown in FIG. 10B without removing the masks made from resist. In this case, the dosage is set lower than that in the first doping process, and the impurities imparting n-type is doped at a high accelerating voltage ranging from 70 keV to 120 keV. In this embodiment, the dosage was set to $1.5\times10^{14}/cm^2$ and the acceleration voltage was set to 90 keV. The second shaped conductive layers 828 to 833 are used as masks and the second doping process is performed so that the impurity element is doped also in the semiconductor layer provided below the second conductive layers 828b to 833b and thus second high-concentration impurity regions 823a to 827a, and low-concentration impurity regions 823b to 827b are newly formed.

Figure 10C:
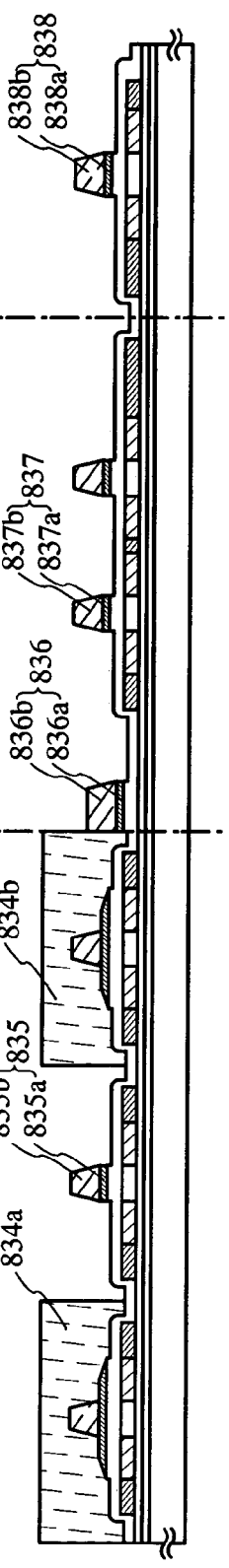

Next, after removing the mask made from resist, new masks made from resist 834a and 834b are formed, and a third etching process is performed as shown in FIG. 10C. $SF_6$ and $Cl_2$ are used as the etching gas at a gas flow rate 50:10 (sccm) and plasma is generated by applying 500 W RF (13.56 MHz) to a coil shaped electrode at a pressure of 1.3 Pa. Then the etching process is performed for about 30 seconds. 10 W RF (13.56 MHz) electric power is also applied to the substrate side (sample stage), and thereby substantially a negative self-bias voltage is impressed. Through the third etching process, the TaN film of p-channel TFT and TFT in pixel portion (pixel TFT) is etched to form third shaped conductive layers 835 to 838.

Then after removing the mask made from resist, the second shaped conductive layers 828, 830 and the third shaped conductive layers 835 to 838 are used as the masks to remove the gate insulating film 816 selectively so as to form the insulating layers 839 to 844 (FIG. 11A).

Next, after forming new masks 845a to 845c made from resist, a third doping process is performed. Through the third doping process, impurity regions 846 and 847 are formed by doping the impurities imparting conductivity type opposite to the former conductivity type to the semiconductor layer that will be an active layer of the p-channel TFT. The second conductive layers 835a and 838a are used as the masks against the impurities and the impurity element imparting p-type is doped to form the impurity region in a self-aligning manner. In this embodiment, the impurity regions 846 and 847 are formed with the ion doping with diborane ($B_2H_6$). (FIG. 11B) Through the third doping process, the semiconductor layer forming n-channel TFT is covered with the mask made from resist 845a to 845c. Although phosphorus is doped to the impurity regions 846 and 847 at a different concentration respectively through the first and the second doping processes, doping processes are performed so that the concentration of the impurities imparting p-type may be between $2\times10^{20}/cm^3$ and $2\times10^{21}/cm^3$ in both regions, and thereby these regions work as the source region and the drain region of p-channel TFT without any problems. In this embodiment, since a part of the semiconductor layer that will be the active layer of p-channel TFT is exposed, it has an advantage that the impurity element (boron) is easily doped.

The impurity region is formed in each semiconductor layer according to the above processes.

Next, masks made from resist 845a to 845c are removed and a first interlayer insulating film 861 is formed. The first interlayer insulating film 861 is formed of an insulating film including silicon having a thickness ranging from 100 nm to 200 nm with the plasma CVD or the sputtering. In this embodiment, a silicon oxynitride film was formed 150 nm in thickness with the plasma CVD. Of course, not only the silicon oxynitride film, but also other insulating film including silicon may be used as the first interlayer insulating film 861 in a single-layer structure or in a laminated-layer structure.

Next, a heating process is performed to recover the crystallinity of the semiconductor film, and to activate the impurity element added in the respective semiconductor layers as shown in FIG. 11C. This heating process is performed with the thermal annealing method using a annealing furnace. The thermal annealing is performed in the atmosphere of nitrogen including oxygen not more than 1 ppm, preferably not more than 0.1 ppm, at a temperature ranging from 400° C. to 700° C., typically from 500° C. to 550° C. In this embodiment, the heating process is performed at a temperature of 550° C. for four hours for the activation. Not only the thermal annealing method, but also laser annealing method and rapid thermal annealing method (RTA method) can be employed. As for the laser annealing method, the method shown in the embodiment mode may be employed.

In addition, a heating process may be performed before forming the first interlayer insulating film. However, when the material for the wirings does not have enough resistance against heat, it is preferable that the interlayer insulating film (such as the insulating film including silicon as its main component, for example a silicon nitride film) is formed in order to protect the wirings and the like before the activating process as shown in this embodiment.

Furthermore, a heating process is performed in the atmosphere of hydrogen in the range of 3% to 100% at a temperature ranging from 300° C. to 550° C. for one hour to 12 hours in order to hydrogenate the semiconductor layer. In this embodiment, the heating process was performed in the atmosphere of nitrogen including hydrogen for 3% at a temperature of 410° C. for one hour. This process is to terminate the dangling bond in the semiconductor layer with hydrogen included in the interlayer insulating film. As the other means for hydrogenation, plasma hydrogenation (using hydrogen excited by plasma) may be performed.

Next, a second interlayer insulating film 862 comprising an inorganic insulating material or an organic insulating material is formed on the first interlayer insulating film 861. In this embodiment, the second interlayer insulating film 862 was formed of an acrylic resin film having a thickness of 1.6 μm, and having a viscosity in the range of 10 cp to 1000 cp, preferably from 40 cp to 200 cp, whose surface can be made convex and concave.

In this embodiment, in order to prevent mirror reflection, concavity and convexity may be formed on the surface of the pixel electrode by forming the second interlayer insulating film on which the concavity and convexity can be formed. And a convex portion may be formed in the region below the pixel electrode in order to scatter the light by making the surface of the pixel electrode concave and convex. In such a case, the convex portion can be formed with the same photomask as that when forming the TFT, and thereby the number of the processes does not need to be increased.

It is noted that the convex portion may be provided in the pixel region except for the wirings and TFT on the substrate appropriately. Concavity and convexity are thus formed on the surface of the pixel electrode along the concavity and convexity formed on the surface of the insulating film covering the convex portion.

Moreover, a film whose surface is planarized may be used as the second interlayer insulating film 862. In such a case, it is preferable that after forming the pixel electrodes, the surface is made concave and convex by adding the process such as the known sandblasting method, etching method or the like, to prevent the mirror reflection and to scatter the reflecting light so as to increase the degree of whiteness.

And in a driver circuit 906, wirings 863 to 867 connecting electrically to each impurity region are formed. It is noted that these wirings are formed by patterning the laminated film of the Ti film having a thickness of 50 μm, and an alloy film (alloy film of Al with Ti) having a thickness of 500 nm.

Figure 12:
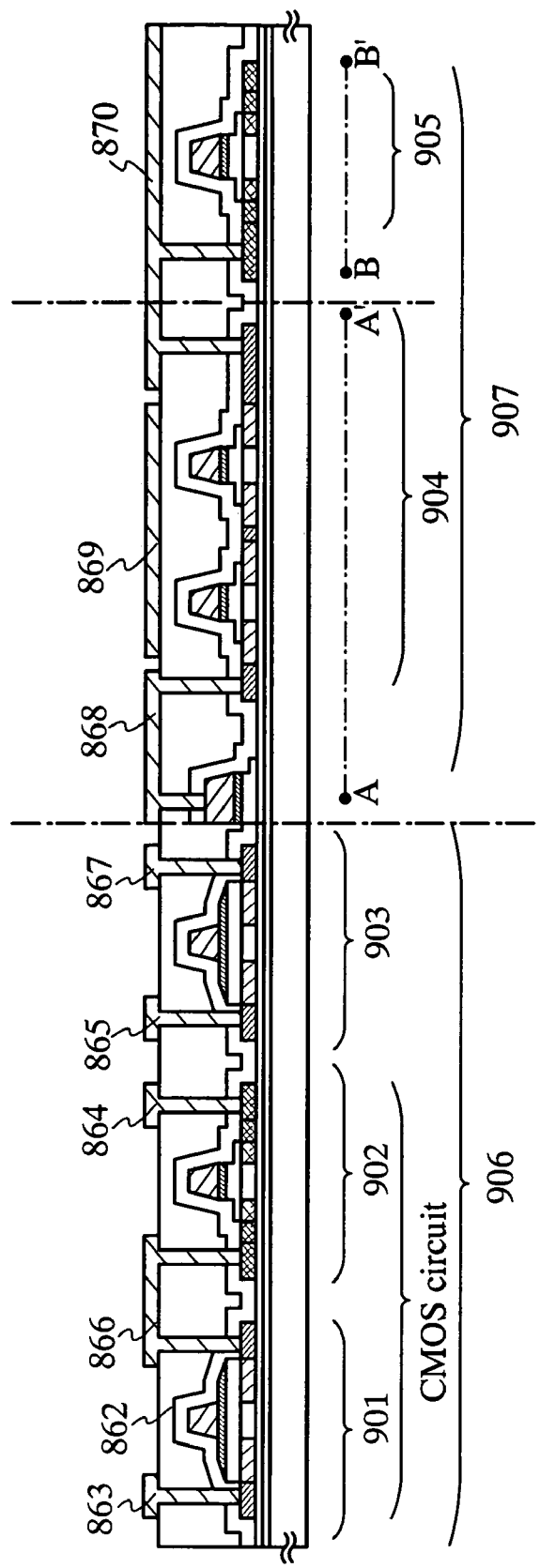
FIG. 12 is a sectional view to show a process to manufacture a pixel TFT and TFT of a driver circuit.

In the pixel portion 907, a pixel electrode 870, a gate wiring 869, and a connecting electrode 868 are formed (FIG. 12). The connecting electrode 868 forms an electrical connection between the source wiring (the laminated layer of 843*b* and 849) and the pixel TFT. In addition, the gate wiring 869 and the gate electrode of the pixel TFT are electrically connected. Moreover, the pixel electrode 870 is electrically connected with the drain region 842 of the pixel TFT and is further electrically connected with the semiconductor layer 858 to function as an electrode of a storage capacitor (also called a retention capacitor). In addition, it is preferable that the pixel electrode 870 is formed of the material with high reflectivity such as a film including Al or Ag as its main component or a laminated layer of the above films.

With these procedures, a driver circuit 906 having a CMOS circuit including n-channel TFT 901 and p-channel TFT 902, and a n-channel TFT 903, and a pixel portion 907 having a pixel TFT 904 and a retention volume 905 can be integrated on the same substrate. Thus an active matrix substrate is completed.

The n-channel TFT 901 included in the driver circuit 906 has a channel forming region 823*c*, a low-concentration impurity region 823*b* (GOLD region) overlapping with the first conductive layer 828*a* forming a part of the gate electrode, and a high-concentration impurity region 823*a* functioning as a source region or a drain region. The p-channel TFT 902 forming a CMOS circuit by connecting this n-channel TFT 901 with the electrode 866 has a channel forming region 846*d*, impurity regions 846*b* and 846*c* formed outside of the gate electrode, and a high-concentration impurity region 846*a* functioning as a source region or a drain region. Moreover, the n-channel TFT 903 has a channel forming region 825*c*, a low-concentration impurity region 825*b* (GOLD region) overlapping with the first conductive layer 830*a* comprising a part of the gate electrode, and a high-concentration impurity region 825*a* functioning as a source region or a drain region.

The pixel TFT 904 in the pixel portion has a channel forming region 826*c*, a low-concentration impurity region 826*b* (LDD region) formed outside of the gate electrode, and a high-concentration impurity region 826*a* functioning as a source region or a drain region. And the semiconductor layers 847*a* and 847*b* functioning as one electrode of the storage capacitor 905 are doped impurities imparting p-type respectively. The storage capacitor 905 is formed of the electrode (the laminated layer of 838*a* with 838*b*) and the semiconductor layers 847*a* to 847*c*, having the insulating film 844 as its dielectric.

In addition, in this embodiment, the pixel is constructed in such a way that the space between the pixel electrodes is shielded from the light by having the ends of the pixel electrodes overlapped with the source wirings without forming black matrix.

Figure 13:
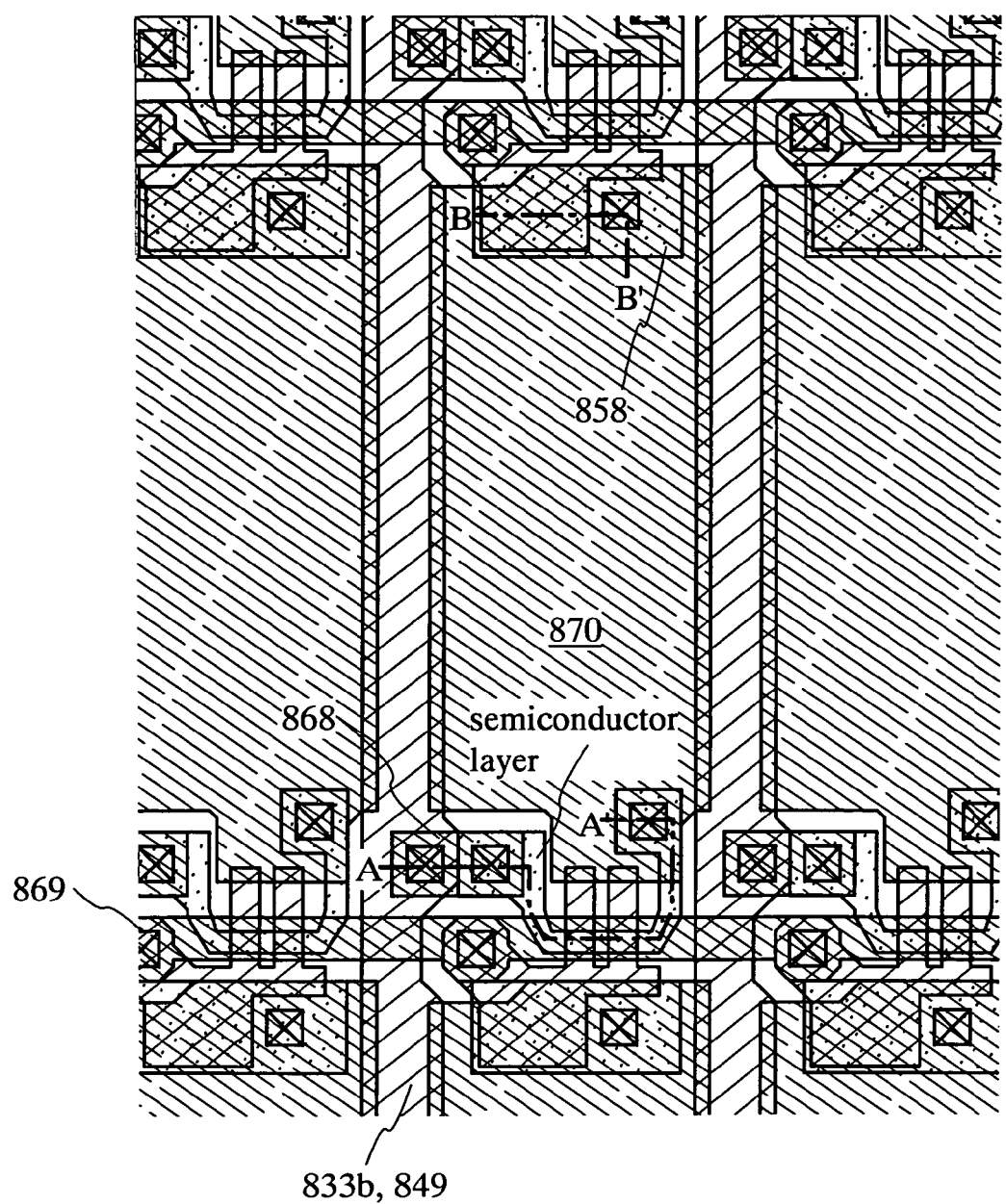
FIG. 13 is a sectional view to show a structure of a pixel TFT.

In addition, FIG. 13 is a top view of the pixel portion in the active matrix substrate manufactured in this embodiment. It is noted that the same reference number is used in the same part in FIG. 9A to 12. A dotted line A-A' in FIG. 12 corresponds to a sectional view taken along a dotted line A-A' in FIG. 13. Moreover, a dotted line B-B' in FIG. 12 corresponds to a sectional view taken along a dotted line B-B' in FIG. 13.

Embodiment 2

Figure 14:
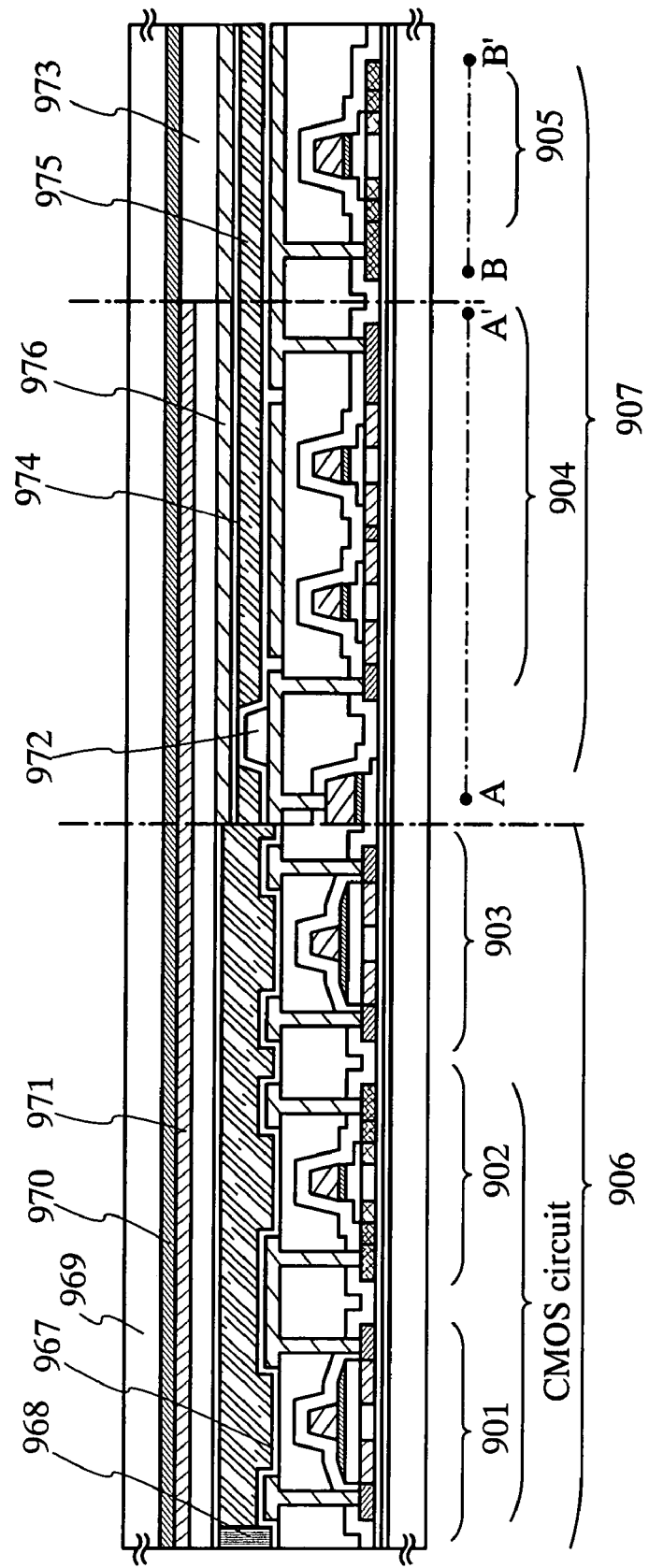
FIG. 14 is a sectional view to show a process to manufacture an active matrix liquid crystal display device.

This embodiment explains a process to manufacture a liquid crystal display device of reflecting type using the active matrix substrate manufactured in the embodiment 1. FIG. 14 is used for the explanation.

First of all, the active matrix substrate in a state shown in FIG. 12 is prepared according to the processes in the embodiment 1. Then, an alignment film 967 is formed on the active matrix substrate in FIG. 12, at least on the pixel electrode 870, and is rubbed. It is noted that before forming the alignment film 967, a columnar spacer 972 is formed in the desired position in order to keep enough space between the substrates by patterning the organic resin film such as the acrylic resin film or the like in this embodiment. Spherical spacers may be dispersed all over the substrate instead of the columnar spacer.

Next, an opposing substrate 969 is prepared. Then, a coloring layer 970, 971 and a planarizing film 973 are formed on the opposing substrate 969. The red coloring layer 970 and the blue coloring layer 971 are overlapped to form a light-shielding portion. Alternatively the red coloring layer and the green coloring layer may be overlapped partially to form the light-shielding portion.

In this embodiment, the substrate shown in the embodiment 1 is used. Therefore, in FIG. 13 showing the top view of the pixel portion in the embodiment 1, it is necessary to shield the following spaces from the light; a space between the gate wiring 869 and the pixel electrode 870, a space between the gate wiring 869 and the connecting electrode 868, and a space between the connecting electrode 868 and the pixel electrode 870. In this embodiment, each coloring layer is arranged so that the light-shielding portions comprising the laminated coloring layers are overlapped on the position which should be shielded from the light as described above, and the opposing substrate is then pasted.

Thus it became possible to reduce the number of processes by shielding the spaces between each pixel from the light with the light-shielding portion comprising the coloring layers without forming the light-shielding layer such as a black mask.

Next, an opposing electrode 976 comprising a transparent conductive film is formed on the planarizing film 973, at least on the pixel portion, and then an alignment film 974 is formed all over the surface of the opposing substrate and is rubbed.

And the active matrix substrate on which the pixel portions and the driver circuits are formed is pasted to the opposing substrate with sealing material 968. Filler is contained in the sealing material 968 and the two substrates are pasted while keeping a uniform space by this filler and the polar spacer. After that, liquid crystal material 975 is injected between the substrates and the two substrates are sealed with sealant (not shown in the figure) completely. The known liquid crystal material may be employed for the liquid crystal material 975. Thus the liquid crystal display device of reflection type is completed. And if necessary, the active matrix substrate or the opposing substrate is cut into a desired shape. Moreover, a polarization plate (not shown in the figure) is pasted only to the opposing substrate. And FPC (flexible print circuit) is pasted with the known technique.

The liquid crystal display device thus manufactured can be employed for the display portion in various kinds of the electrical devices. It is noted that this embodiment can be freely combined with embodiment 1.

Embodiment 3

This embodiment explains an example in which the present invention is applied to manufacture a light-emitting device. In this specification, the light-emitting device is a generic term for a display panel where the light-emitting element formed on the substrate is included between the substrate and the cover member, and for a display module where the display panel is equipped with IC. It is noted that the light-emitting element has a layer (light-emitting layer) including an organic compound giving electroluminescence by applying electric field, a cathode layer and an anode layer. And the luminescence in the organic compound includes one or both of the luminescence (fluorescence) when returning from the singlet excited state to the ground state, and the luminescence (phosphorescence) when returning from the triplet excited state to the ground state.

Figure 15:
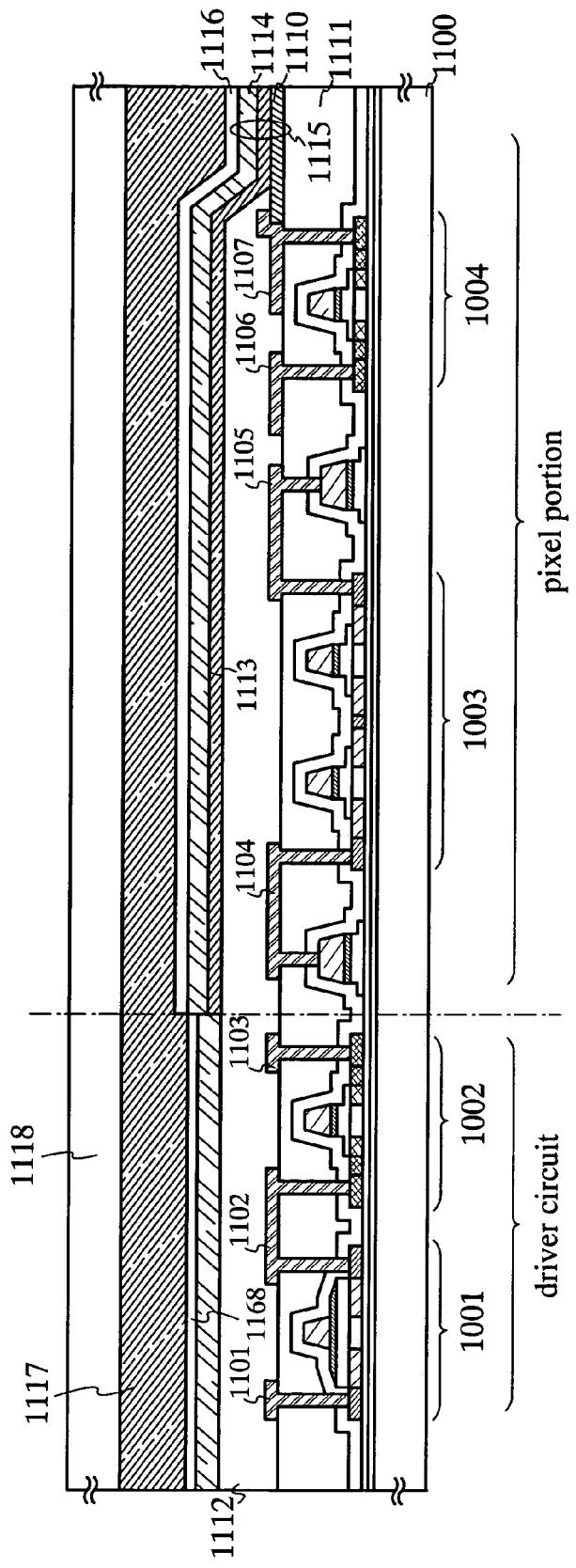
FIG. 15 is a sectional view of a driver circuit and a pixel portion of a light-emitting device.

FIG. 15 is a sectional view of the light-emitting device in this embodiment. In FIG. 15, a switching TFT 1003 provided on the substrate 1100 is formed with n-channel TFT 1303 in FIG. 12. Therefore, concerning the structure of the switching TFT 1003, the explanation of the n-channel TFT 1303 may be referred to.

It is noted that this embodiment explains a double-gate structure in which two channel forming regions are formed, but a single-gate structure or triple-gate structure may be also employed.

The driver circuit provided on the substrate 1100 is formed with the CMOS circuit in FIG. 12. Therefore, concerning the structure of the driver circuit, the explanation about the structure of the n-channel TFT 1301 and p-channel TFT 1302 may be referred to. It is noted that this embodiment explains a single-gate structure, but a double-gate structure or a triple-gate structure may be also employed.

It is noted that the wiring 1101 and 1103 function as the source wiring of the CMOS circuit, and the wiring 1102 functions as the drain wiring of the CMOS circuit. In addition, the wiring 1104 functions as the wiring that electrically connects the source wiring 1108 with the source region of the switching TFT. The wiring 1105 functions as the wiring that connects electrically the drain wiring 1109 and the drain region of the switching TFT.

It is noted that a current controlling TFT 1004 is formed with the p-channel TFT 1302 in FIG. 12. Therefore, concerning the structure of the current controlling TFT 1004, the explanation of the p-channel TFT 1302 may be referred to. It is noted that in this embodiment, it is formed in a single-gate structure, but may be also formed in a double-gate or a triple-gate structure.

The wiring 1106 is the source wiring of the current controlling TFT (corresponding to a current supply line) and a reference number 1107 is an electrode electrically connecting with the pixel electrode 1110 of the current controlling TFT by being overlapped on the pixel electrode 1110 thereof.

It is noted that a reference number 1110 is a pixel electrode (the anode of the light-emitting element) comprising the transparent conductive film. The transparent conductive film can be formed of a compound of indium oxide and tin oxide, a compound of indium oxide and zinc oxide, zinc oxide, tin oxide, or indium oxide. Moreover, the transparent conductive film added gallium may be also employed. The pixel electrode 1110 is formed on the plane interlayer insulating film 1111 before forming those wirings. In this embodiment, it is very important to planarize the steps due to the TFT with the planarizing film 1111 made of resin. This is because the light-emitting layer that is formed later is so thin that the faulty luminance might occur due to the steps. Therefore, it is preferable to planarize before forming the pixel electrode so that the light-emitting layer is formed on the plane as even as possible.

After forming the wirings 1101 to 1107, a bank 1112 is formed as shown in FIG. 15. The bank 1112 is formed by patterning the insulating film including silicon, or the organic resin film, having a thickness ranging from 100 nm to 400 nm.

It is noted that attention must be paid for the element when the bank 1112 is formed so that the element may not be damaged due to electrostatic discharge because the bank 1112 is an insulating film. In this embodiment, the resistivity is lowered by adding the carbon particles or the metal particles in the insulating film, that is a material for the bank 1112, so as to suppress the static electricity. In such a case, the amount of the carbon particles or the metal particles is adjusted so that the resistivity is in the range of $1\times10^6$ $\Omega$m to $1\times10^{12}$ $\Omega$m (preferably from $1\times10^8$ $\Omega$m to $1\times10^{10}$ $\Omega$m).

A light-emitting layer 1113 is formed on the pixel electrode 1110. It is noted that FIG. 15 shows only one pixel but in this embodiment the light-emitting layers are made in parts corresponding to each color of R (red), G (green) and B (blue). In addition, in this embodiment, a low molecular weight organic light-emitting material is formed by an evaporation method. Specifically, a laminated-layer structure is employed in which a copper phthalocyanine (CuPc) film having a thickness of 20 nm is formed as the hole injecting layer, and a tris-8-quinolinolato aluminum complex ($Alq_3$) film having a thickness of 70 nm is formed thereon as the light-emitting layer. Adding the pigment such as quinacridone, perylene, DCM1 or the like to $Alq_3$ can control the color.

However, the organic light-emitting material available for the light-emitting layer is not limited to those described above at all. The light-emitting layer, the charge transporting layer, and the charge injecting layer are freely combined to form the light-emitting layer (the layer for luminescence and for moving the carrier for the luminescence). For instance, this embodiment shows an example in which the low molecular weight organic light-emitting material is employed for the light-emitting layer, but the high molecular weight organic light-emitting material may be also employed. In addition, an inorganic material such as silicon carbide can be also used as the charge transporting layer and the charge injecting layer. Any known material can be used for these organic light-emitting material and inorganic material.

Next, a cathode 1114 including the conductive film is provided on the light-emitting layer 1113. In this embodiment, an alloy film of aluminum and lithium is used as the conductive film. Of course, the known MgAg film (the alloy film of magnesium and silver) can be also used. A conductive film formed of the first or second element in the periodic table or a conductive film added with these elements can be used as the cathode material.

When the processes are performed up to form the cathode 1114, the light-emitting element 1115 is completed. It is noted that the light-emitting element 1115 described here indicates a diode formed of the pixel electrode (anode) 1110, the light-emitting layer 1113 and the cathode 1114.

It is effective to provide a passivation film 1116 so as to cover the light-emitting element 1115 completely. The passivation film 1116 is formed of the insulating film including a carbon film, a silicon nitride film, or a silicon nitride oxide film, in a single-layer or in a laminated-layer structure.

Here, it is preferable to employ the film whose coverage is good as the passivation film, and it is effective to employ the carbon film, especially a diamond-like carbon (DLC) film. The DLC film can be formed at a temperature ranging from the room temperature to 100° C. Therefore, the DLC film can be easily formed over the light-emitting layer 1113 having low resistance against heat. Moreover, the DLC film is superior in its blocking effect against oxygen, and thereby it is possible to suppress oxidization of the light-emitting layer 1113. Therefore, it can prevent the light-emitting layer 1113 from being oxidized during the following sealing process.

Moreover, the sealant 1117 is provided on the passivation film 1116 to paste the cover member 1118. A UV cure resin may be used as the sealant 1117 and it is effective to provide the absorbent material or antioxidant material inside. In addition, in this embodiment, the cover member 1118 is a glass substrate, a quartz substrate, or a plastic substrate (including plastic film), having carbon films (preferably DLC films) formed on opposite sides of the substrate.

Thus the light-emitting device having the structure shown in FIG. 15 is completed. It is, effective to perform continuously all the processes from forming the bank 1112 up to forming the passivation film 1116 in the deposition system of multi-chamber type (or in-line type) without releasing it to the air. Furthermore, it is possible to have the further processes up to pasting the cover member 1118 performed continuously without releasing it to the air.

Thus, n-channel TFT 1001, 1002, a switching TFT (n-channel TFT) 1003, and a current controlling TFT (n-channel TFT) 1004 are formed on a substrate made of a plastic for example. The number of masks needed in these manufacturing processes is less than that in manufacturing a general active matrix light-emitting device.

That is to say, the process for manufacturing TFT is simplified to a large degree, and thereby the yield can be improved, and the production cost can be lowered.

In addition, as explained in FIG. 15, providing an impurity region overlapped by the gate electrode through the insulating film can form the n-channel TFT that has enough resistance against deterioration due to the hot-carrier effect. Therefore, the light-emitting device with high reliability can be obtained.

Although this embodiment shows only the structure of the pixel portion and the driver circuit, another logic circuit such as a signal divider circuit, a D/A converter, an operational amplifier, a y correction circuit and the like can be further formed on the same insulating substrate according to the manufacturing processes in this embodiment. Moreover, a memory and a microprocessor can be further formed.

Furthermore, the light-emitting device in this embodiment in which a process up to sealing in order to protect the light-emitting element is performed, is explained with FIGS. 16A and 16B. It is noted that a reference number used in FIG. 15 is referred to if necessary.

FIG. 16A is a top view to show an aspect in which the process up to sealing the light-emitting element is performed. FIG. 16B is a sectional view taken along C-C' in FIG. 16A. A reference number 1205 drawn with a dotted line is a driver circuit on the source side, a reference number 1206 is a pixel portion, a reference number 1207 is a driver circuit on the gate side. In addition, a reference number 1301 is a cover member, 1302 is a first sealing material, 1303 is a second sealing material, and 1307 is a sealant provided in the space surrounded by the first sealing material 1302.

It is noted that a reference number 1304 is a wiring to transmit signal input in the driver circuit on the source side 1205 and the driver circuit on the gate side 1207, and it receives video signal or clock signal from FPC (flexible print circuit) 1305 that is an external input terminal. In addition, although only FPC is shown diagrammatically, this FPC may be equipped with a printed-wiring board (PWB). The light-emitting device in this specification includes not only the light-emitting device itself, but also the light-emitting device equipped with FPC or PWB.

Next, the sectional structure is explained with FIG. 16B. The pixel portion 1206 and the driver circuit on the gate side 1207 are formed above the substrate 1100. The pixel portion 1206 is formed of the current controlling TFT 1004 and a plurality of pixels including the pixel electrode 1110 connected electrically with the drain of the current controlling TFT 1004. In addition, the driver circuit on the gate side 1207 is formed of a CMOS circuit (refer to FIG. 15) in which the n-channel TFT 1001 and the p-channel TFT 1002 are combined.

The pixel electrode 1110 functions as the anode of the light-emitting element. In addition, the bank 1112 is formed on opposite ends of the pixel electrode 1110, and the light-emitting layer 1113 and the cathode 1114 of the light-emitting element is formed on the pixel electrode 1110.

The cathode 1114 also functions as the wiring common to all the pixels and is connected electrically to FPC 1305 through the connecting wiring 1304. Further, all the elements included in the pixel portion 1206 and the driver circuit on the gate side 1207 are covered with the cathode 1114 and the passivation film 1116.

Moreover, the cover member 1301 is pasted with the first sealing material 1302. It is noted that a spacer made from a resin film may be provided in order to keep the space between the cover member 1301 and the light-emitting element. And the sealant 1307 is filled inside the first sealing material 1302. It is preferable to employ epoxy resin as the first sealing material 1302 and the sealant 1307. In addition it is desirable to employ the material which is as hard as possible to transmit moisture and oxygen. Moreover, the material having moisture-absorption characteristic or the material providing protection against oxidization may be included inside the sealant 1307.

The sealant 1307 provided so as to cover the light-emitting element also functions as an adhesive material in order to adhere the cover member 1301. In addition, FRP (Fiberglass-Reinforced Plastics), PVF (polyvinyl fluoride), mylar, polyester, or acrylic can be employed as the material for a plastic substrate 1301a constituting the cover member 1301.

In addition, after adhering the cover member 1301 with the sealant 1307, the second sealing material 1303 is provided so as to cover the side surface (the exposed side) of the sealant 1307. The second sealing material 1303 can be formed of the same material as that of the first sealing material 1302.

Enclosing the light-emitting element into the sealant 1307 with the above structure makes it possible to shield the light-emitting element completely from outside, and thereby the material such as moisture and oxygen promoting deterioration due to oxidization of the light-emitting layer can be prevented from intruding from outside. Therefore, a light-emitting device with high reliability can be obtained.

It is noted that this embodiment can be freely combined with embodiment 1 or 2.

Embodiment 4

This embodiment explains with FIG. 17A to 19D a semiconductor device in which the active matrix type liquid crystal display device including TFT circuit according to the present invention is incorporated.

As the example of such a semiconductor device, a personal digital assistant (such as an electronic data book, a mobile computer, a cellular phone and the like), a video camera, a still camera, a personal computer, a television and the like are given. FIG. 17A to 18D show these examples.

Figure 17A:
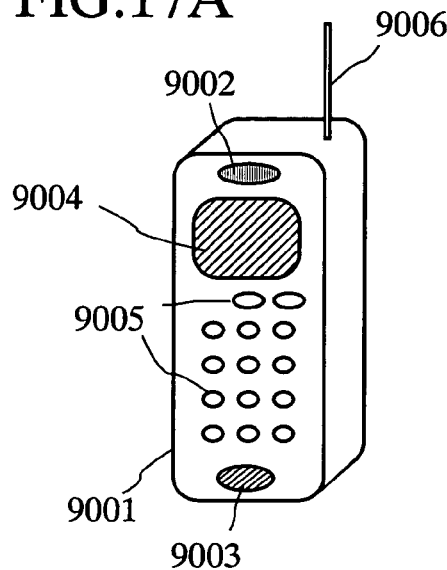
FIG. 17A to 17E are drawings to show examples of a semiconductor device.

FIG. 17A shows a cellular phone, including a main body 9001, a voice output portion 9002, a voice input portion 9003, a display device 9004, an operating switch 9005, and an antenna 9006. The present invention can be applied to the voice output portion 9002, the voice input portion 9003, and the display device 9004 equipped with the active matrix substrate.

Figure 17B:
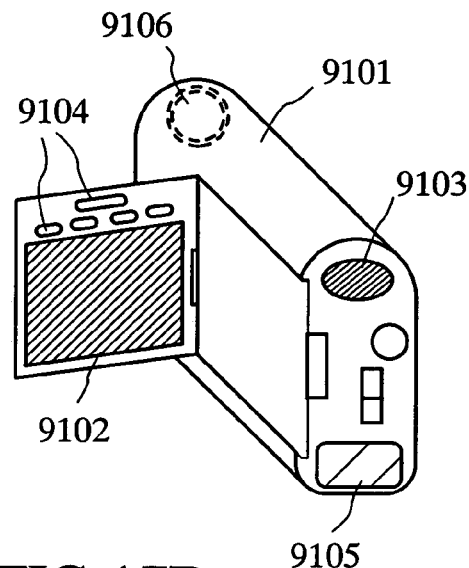

FIG. 17B shows a video camera, including a main body 9101, a display device 9102, a voice input portion 9103, an operating switch 9104, a battery 9105, and an image receiver 9106. The present invention can be applied to the voice input portion 9103, the image receiver 9106 and the display device 9102 equipped with the active matrix substrate.

Figure 17C:
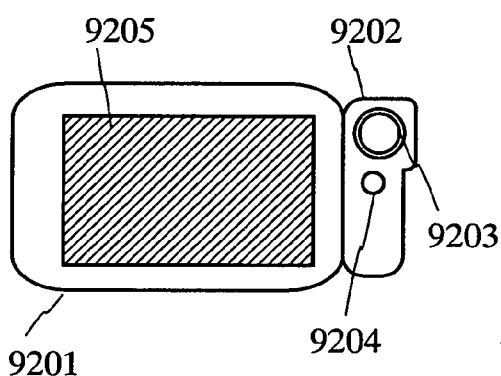

FIG. 17C shows a mobile computer or a personal digital assistant, including a main body 9201, a camera portion 9202, an image receiver 9203, an operating switch 9204, and a display device 9205. The present invention can be applied to the image receiver 9203 and the display device 9205 equipped with the active matrix substrate.

Figure 17D:
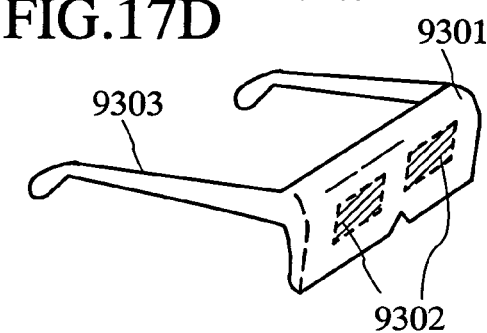

FIG. 17D shows a goggle type display, including a main body 9301, a display device 9302, and an arm portion 9303. The present invention can be applied to the display device 9302. In addition, it can be applied to other signal controlling circuits though they are not shown in the figure.

Figure 17E:
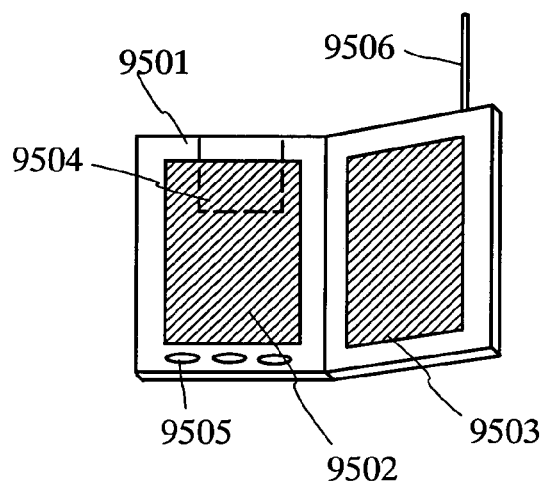

FIG. 17E shows a mobile book, including a main body 9501, display devices 9502 and 9503, a recording medium 9504, an operating switch 9505, and an antenna 9506. The mobile book is to display the data received with the antenna 9506 or the data recorded in a minidisk (MD) and DVD. The present invention can be applied to the display devices 9502 and 9503, that are direct view displays.

Figure 18A:
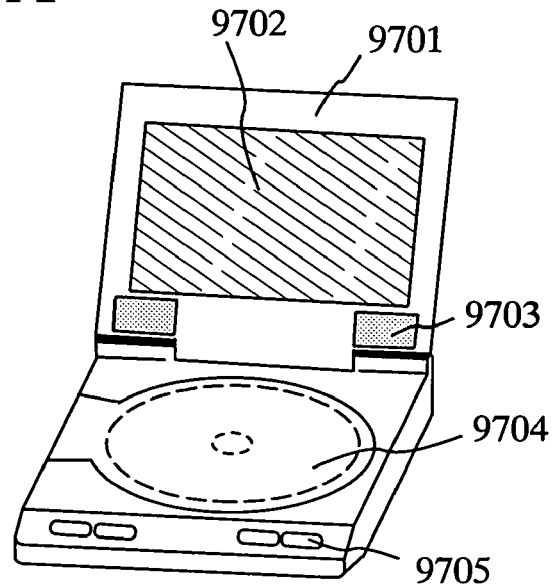
FIG. 18A to 18C are drawings to show examples of a semiconductor device.

FIG. 18A shows a player utilizing a recording medium that has a program recorded (hereinafter referred to as a recording medium) including a main body 9701, a display device 9702, a speaker portion 9703, a recording medium 9704, and an operating switch 9705. It is noted that this player makes it possible to enjoy listening to the music, watching the movies, playing the game, and playing on the Internet using a DVD (Digital Versatile Disc), CD or the like as its recording medium.

Figure 18B:
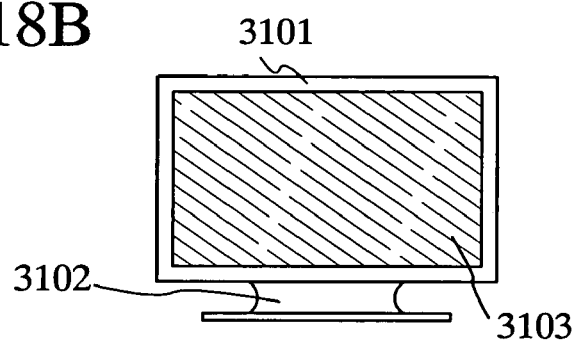

FIG. 18B shows a television, including a main body 3101, a supporting stand 3102, and a display portion 3103.

Figure 18C:
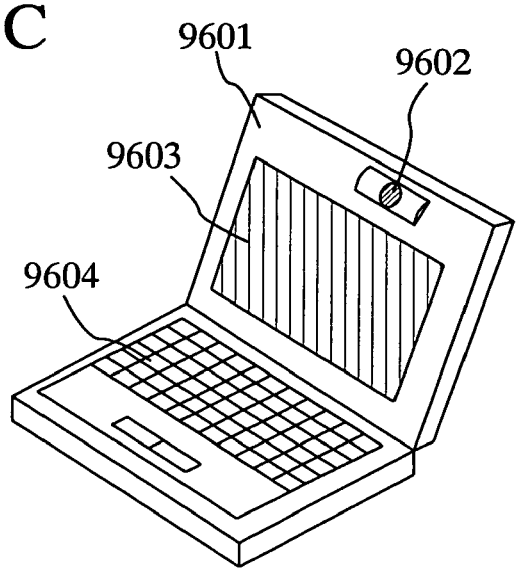

FIG. 18C shows a personal computer, including a main body 9601, an image input portion 9602, a display device 9603, and a keyboard 9604.

Figure 19A:
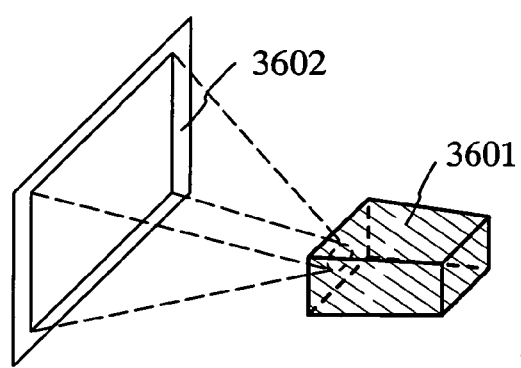
FIG. 19A to 19D are drawings to show examples of a semiconductor device.

FIG. 19A shows a front projector, including a projection device 3601, and a screen 3602. The present invention can be applied to the projection device 3601 and other signal controlling circuits.

Figure 19B:
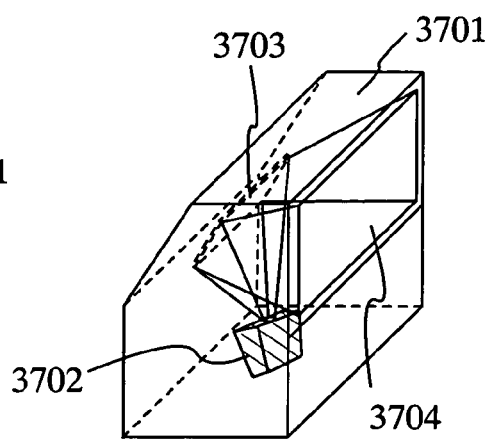

FIG. 19B shows a rear projector, including a main body 3701, a projection device 3702, a mirror 3703, and a screen 3704. The present invention can be applied to the projection device 3702 and other signal controlling circuits.

Figure 19C:
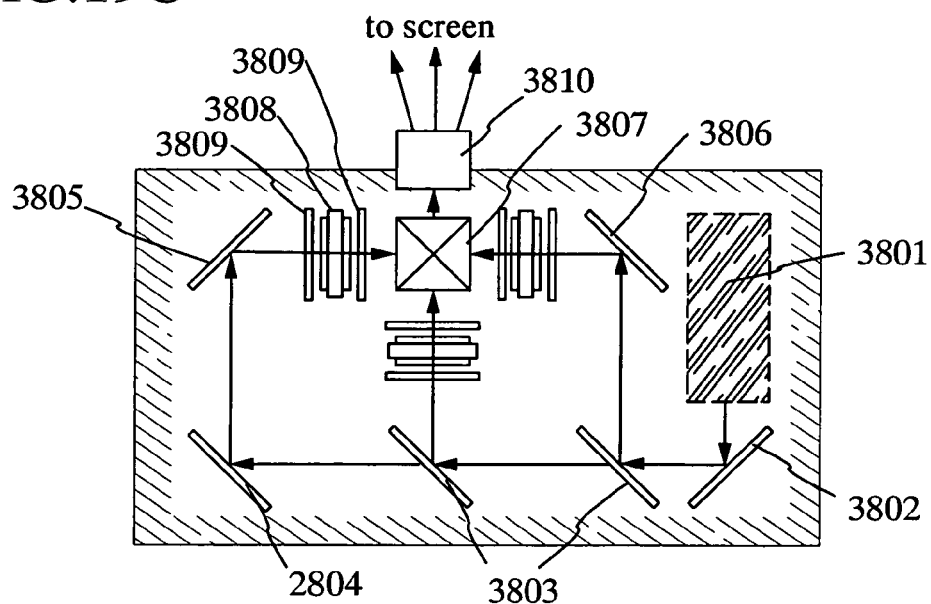

It is noted that FIG. 19C is a drawing to show an example of the structure of the projection device 3601 in FIG. 19A and the projection device 3702 in FIG. 19B. The projection devices 3601 and 3702 include an optical system of light source 3801, mirrors 3802, 3804 to 3806, a dichroic mirror 3803, a prism 3807, a liquid crystal display device 3808, a wave plate 3809, and a projection optical system 3810. The projection optical system 3810 has an optical system including a projection lens. This example showed the projection device of three-plate type, but there is no limitation on this, and the projection device of single-plate type is also acceptable. Moreover, the practitioner may arrange an optical lens, a film having a polarizing function, a film for adjusting phase contrast, an IR film or the like in the optical path shown by an arrow in FIG. 19C.

Figure 19D:
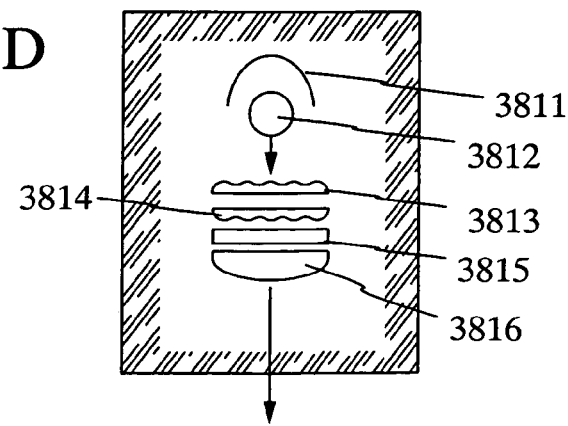

Moreover, FIG. 19D shows an example of the structure of the optical system of light source 3801 including a reflector 3811, a light source 3812, lens arrays 3813, 3814, a polarization changing element 3815, and a condensing lens 3816. It is noted that the optical system of light source shown in FIG. 19D is just one of the examples, and is not limited to that described above. For example, the practitioner may provide an optical lens, a film having a polarizing function, a film for adjusting phase contrast, an IR film or the like in the optical system appropriately.

Furthermore, the present invention can be also applied to a display element of light-emitting type. As described above, the present invention can be applied to various kinds of devices, and can be applied to the electronics device in every field. It is noted that the electronics device in this embodiment can be freely combined with any of the embodiments 1 to 3.

What is claimed is:

1. A laser irradiation method comprising the steps of:
shaping a first laser beam having a wavelength not longer than that of visible light into an elongated beam on a surface to be irradiated, wherein said first laser beam is a harmonic wave of a solid laser;
irradiating the surface with the elongated beam wherein an irradiation area of the elongated beam has at least a first portion and a second portion, said first portion having a lower energy density than the second portion; and
irradiating the surface with a second laser beam concurrently with the elongated beam, said second laser beam having a fundamental wave emitted from a solid laser, in such a manner that an irradiation area of the second laser beam overlaps at least the first portion of the irradiation area of the elongated beam while moving the surface relatively to the elongated beam and the second laser beam in a first direction.

2. A laser irradiation method comprising the steps of:
shaping a first laser beam having a wavelength not longer than that of visible light into an elongated beam on a surface to be irradiated, wherein said first laser beam is a harmonic wave of a solid laser;
irradiating the surface with the elongated beam wherein an irradiation area of the elongated beam on the surface has at least a first portion and a second portion, said first portion having a lower energy density than said second portion; and
irradiating the surface with a second laser beam emitted from a solid laser concurrently with the elongated beam wherein an irradiation area of the second laser beam on the surface has at least a first portion and a second portion having a higher energy density than the first portion, said second laser beam having a fundamental wave,
wherein the irradiation of the elongated beam and the second laser beam is performed in such a manner that the second portion of the irradiation area of the second laser beam overlaps at least the first portion of the irradiation area of the elongated beam while moving the surface relatively to the elongated beam and the second laser beam in a first direction.

3. A laser irradiation method according to claim 1 or 2, wherein each of the first laser beam and the second laser beam is emitted from one selected from the group consisting of a YAG laser, a $YVO_4$ laser, a YLF laser, a $YAlO_3$ laser, an alexandrite laser and a Ti: Sapphire laser.

4. A laser irradiation method according to claim 1 or 2, wherein the surface to be irradiated is a film formed over a substrate transparent to the first laser beam having a thickness d, and
wherein an incidence angle φ of the first laser beam to the surface to be irradiated satisfies an inequality φ≧arctan (W/2d), when a major axis of the elongated beam or a minor axis of the elongated beam is assumed to have a length of W.

5. A method of manufacturing a semiconductor device comprising the steps of:
forming a non-single crystalline semiconductor film over a substrate;
shaping a first laser beam emitted from a first laser oscillator into an elongated beam on a surface to be irradiated wherein the first laser beam has a wavelength not longer than that of visible light, wherein said first laser beam is, a harmonic wave of a solid laser;
irradiating the non-single crystalline semiconductor film with the elongated beam wherein an irradiation area of the elongated beam has at least a first portion and a second portion, said first portion having a lower energy density than the second portion, wherein a portion of the non-single crystalline semiconductor film irradiated with the elongated beam is melted;
irradiating at least said portion of the non-single crystalline semiconductor film with a second laser beam emitted from a second lager oscillator, said second laser beam having a fundamental wave emitted from a solid laser, wherein the irradiation of said portion of the non-single crystalline semiconductor film with the second laser beam is performed when said portion is in a molten state due to the irradiation of said first laser beam, and an irradiation area of the second laser beam overlaps at least the first portion of the irradiation area of the elongated beam; and
moving the substrate relatively to the elongated beam and the second laser beam in a first direction, thereby, forming a crystal grain region in the non-single crystalline semiconductor film; and
moving the substrate in a second direction relatively to the elongated beam and the second laser beam.

6. A method of manufacturing a semiconductor device comprising the steps of:
forming a non-single crystalline semiconductor film over a substrate,
shaping a first laser beam emitted from a first laser oscillator into an elongated beam on a surface to be irradiated wherein the first laser beam has a wavelength not longer than that of visible light, wherein said first laser beam is a harmonic wave of a solid laser;
irradiating the non-single crystalline semiconductor film with the elongated beam wherein an irradiation area of the elongated beam has at least a first portion and a second portion, said first portion having a lower energy density than the second portion, wherein a portion of the non-single crystalline semiconductor film irradiated with the elongated beam is melted;
irradiating at least said portion of the non-single crystalline semiconductor film with a second laser beam emitted from a second laser oscillator, said second laser beam having a fundamental wave emitted from a solid laser, wherein an irradiation area of the second laser beam has at least a first portion and a second portion, said second portion having a higher energy density than the first portion;
forming a crystal grain region while moving the substrate in a first direction relatively to the elongated beam and the second laser beam;
moving the substrate in a second direction relatively to the elongated beam and the second laser beam,
wherein the irradiation of said portion of the non-single crystalline semiconductor film with the second laser beam is performed when said portion is in a molten state due to the irradiation of said first laser beam and the irradiation of the elongated beam and the second laser beam is performed in such a manner that the second portion of the irradiation area of the second laser beam overlaps at least the first portion of the irradiation area of the elongated beam.

7. A method of manufacturing a semiconductor device according to claim 5 or 6,
wherein each of the first laser oscillator and the second laser oscillator is selected from the group consisting of a YAG laser, a $YVO_4$ laser, a YLF laser, a $YAlO_3$ laser, an alexandrite laser and a Ti: Sapphire laser.

8. A method of manufacturing a semiconductor device according to claim 5 or 6,
wherein the first direction and the second direction are orthogonal to each other.

9. A method of manufacturing a semiconductor device according to claim 5 or 6,
wherein the substrate is transparent to the first laser beam and has a thickness d, and
wherein an incidence angle φ of the first laser beam to the surface to be irradiated satisfies an inequality φ≧arctan (W/2d), when a major axis of the elongated beam or a minor axis of the elongated beam is assumed to have a length of W.

10. A method of manufacturing a semiconductor device comprising the steps of:
forming a non-single crystalline semiconductor film over a substrate;
irradiating the non-single crystalline semiconductor film with a first laser beam emitted from a first laser oscillator, said first laser beam is a harmonic wave of a solid laser and said first laser beam has a wavelength not longer than that of visible light, wherein an irradiation area of the first laser beam has at least a first portion and a second portion, said first portion having a lower energy density than the second portion, and wherein a portion of the non-single crystalline semiconductor film irradiated with the first laser beam is melted;
irradiating the non-single crystalline semiconductor film with a second laser beam emitted from a second laser oscillator, said second laser beam having a fundamental wave emitted from a solid laser wherein the irradiation of the second laser beam is performed in a molten state of the non-single crystalline semiconductor film by the first laser beam, and an irradiation area of the second laser beam overlaps at least the first portion of the irradiation area of the elongated beam;
moving the substrate relatively to the first laser beam and the second laser beam, thereby, forming a crystal grain region in the non-single crystalline semiconductor film.

11. A method of manufacturing a semiconductor device comprising the steps of:
forming a non-single crystalline semiconductor film over a substrate;
irradiating the non-single crystalline semiconductor film with a first laser beam emitted from a first laser oscillator, said first laser beam is a harmonic wave of a solid laser and said first laser beam has a wavelength not longer than that of visible light, wherein an irradiation area of the first laser beam has at least a first portion and a second portion, said first portion having a lower energy density than the second portion, and wherein a portion of the non-single crystalline semiconductor film irradiated with the first laser beam is melted;
irradiating the non-single crystalline semiconductor film with a second laser beam emitted from a second laser oscillator, said second laser beam having a fundamental wave emitted from a solid laser wherein said second laser beam is selectively absorbed in a molten state of the non-single crystalline semiconductor film by the first laser beam, wherein an irradiation area of the second laser beam has at least a first portion and a second portion, said second portion having a higher energy density than the first portion;
moving the substrate relatively to the first laser beam and the second laser beam, thereby, forming a crystal grain region in the non-single crystalline semiconductor film,
wherein the irradiation of the first laser beam and the second laser beam is performed in such a manner that the second portion of the irradiation area of the second laser beam overlaps at least the first portion of the irradiation area of the first laser beam.

12. A method of manufacturing a semiconductor device according to claim 10 or 11,
wherein each of the first laser oscillator and the second laser oscillator is selected from the group consisting of a YAG laser, a $YVO_4$ laser, a YLF laser, a $YAlO_3$ laser, an alexandrite laser and a Ti: Sapphire laser.

13. A method of manufacturing a semiconductor device according to claim 10 or 11,
wherein the substrate is transparent to the first laser beam and has a thickness d, and
wherein an incidence angle φ of the first laser beam to the surface to be irradiated satisfies an inequality φ≧arctan (W/2d), when a major axis of the first laser beam or a minor axis of the first laser beam is assumed to have a length of W.

14. A laser irradiation method according to claim 1 or 2,
wherein each of the first laser beam and the second laser beam is emitted from a continuous wave solid laser.

15. A method of manufacturing a semiconductor device according to claim 5 or 6,
wherein each of the first laser oscillator and the second laser oscillator is a continuous wave solid laser.

16. A method of manufacturing a semiconductor device according to claim 10 or 11,
wherein each of the first laser oscillator and the second laser oscillator is a continuous wave solid laser.

* * * * *

UNITED STATES PATENT AND TRADEMARK OFFICE
CERTIFICATE OF CORRECTION

| | | |
|---|---|---|
| PATENT NO. | : 7,700,462 B2 | Page 1 of 1 |
| APPLICATION NO. | : 10/787120 | |
| DATED | : April 20, 2010 | |
| INVENTOR(S) | : Koichiro Tanaka et al. | |

It is certified that error appears in the above-identified patent and that said Letters Patent is hereby corrected as shown below:

On the Title Page of the patent, under Related U.S. Application Data, please change "now abandoned" to --now Pat. No. 7,674,663--;

At column 26, line 20, please change "a y correction circuit" to --a $\gamma$ correction circuit--;

At column 29, lines 66 to 67, please change "first laser beam is, a harmonic wave" to --first laser beam is a harmonic wave--;

At column 30, line 10, please change "lager oscillator" to --laser oscillator--.

Signed and Sealed this

Twenty-fourth Day of August, 2010

David J. Kappos
*Director of the United States Patent and Trademark Office*